US012344958B2

(12) United States Patent
Tellekamp, Jr. et al.

(10) Patent No.: US 12,344,958 B2
(45) Date of Patent: Jul. 1, 2025

(54) III-N HETEROEPITAXIAL DEVICES ON ROCK SALT SUBSTRATES

(71) Applicant: Alliance for Sustainable Energy, LLC, Golden, CO (US)

(72) Inventors: Marshall Brooks Tellekamp, Jr., Denver, CO (US); Andriy Zakutayev, Boulder, CO (US); Md Shahadat Hasan Sohel, Littleton, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 611 days.

(21) Appl. No.: 17/580,198

(22) Filed: Jan. 20, 2022

(65) Prior Publication Data
US 2022/0230882 A1    Jul. 21, 2022

Related U.S. Application Data

(60) Provisional application No. 63/139,528, filed on Jan. 20, 2021.

(51) Int. Cl.
*H01L 21/20* (2006.01)
*C23C 14/06* (2006.01)
*C23C 14/34* (2006.01)
*C30B 25/18* (2006.01)
*C30B 29/40* (2006.01)
*H01L 21/02* (2006.01)

(52) U.S. Cl.
CPC ........ *C30B 29/403* (2013.01); *C23C 14/0664* (2013.01); *C23C 14/34* (2013.01); *C30B 25/186* (2013.01); *C30B 29/406* (2013.01); *H01L 21/0242* (2013.01); *H01L 21/02439* (2013.01); *H01L 21/0254* (2013.01); *H01L 21/02631* (2013.01); *H01L 21/2015* (2013.01)

(58) Field of Classification Search
CPC ..... C23C 14/34; C30B 29/403; C30B 29/406; H01L 21/0254; H01L 21/02631; H01L 21/2015
See application file for complete search history.

(56) References Cited

U.S. PATENT DOCUMENTS 5,043,773 A * 8/1991 Precht ..................... H01L 23/15
257/77
5,091,244 A * 2/1992 Biornard ................ G02B 1/116
359/359

(Continued)

OTHER PUBLICATIONS

Amano, H. et al., "The 2020 UV emitter roadmap," Journal of Physics D: Applied Physics, vol. 53, 2020, 57 pages.

(Continued)

*Primary Examiner* — Jaehwan Oh
(74) *Attorney, Agent, or Firm* — Neal S. Vickery

(57) ABSTRACT

Described herein are rock salt substrates and methods of making thereof that are useful as epitaxial substrates for semiconducting materials, including ultra-wide bandgap materials. Advantageously, the described rock salt substrates may be useful as substrates for Group III (Al, Ga, In)—N substrate allowing for pseudomorphic growth of novel, desirable materials. The rock salt may be provided as a bulk material or deposited as a thin film. These substrates may allow for generation of high Al content semiconductor devices with ultra-wide bandgap and other useful properties.

15 Claims, 23 Drawing Sheets

(56) References Cited

U.S. PATENT DOCUMENTS

| | | | | |
|---|---|---|---|---|
| 5,190,890 | A * | 3/1993 | Precht | H01L 23/15 |
| | | | | 117/97 |
| 5,492,752 | A * | 2/1996 | Parsons | C30B 29/36 |
| | | | | 428/697 |
| 9,614,124 | B2 * | 4/2017 | Fukuyama | H01L 21/02664 |
| 10,418,522 | B2 * | 9/2019 | Xi | H10H 20/825 |
| 2003/0134447 | A1 * | 7/2003 | Shibata | H01L 21/02505 |
| | | | | 257/E21.127 |
| 2004/0209390 | A1 * | 10/2004 | Senda | C30B 29/403 |
| | | | | 438/483 |
| 2008/0295879 | A1 * | 12/2008 | Atanackovic | H10N 10/855 |
| | | | | 250/338.2 |
| 2010/0075176 | A1 * | 3/2010 | Yamada | C23C 14/5806 |
| | | | | 359/359 |
| 2010/0129536 | A1 * | 5/2010 | Yamada | C03C 17/2456 |
| | | | | 204/192.15 |
| 2011/0011632 | A1 * | 1/2011 | Nakao | C23C 14/083 |
| | | | | 427/126.3 |
| 2011/0135928 | A1 * | 6/2011 | Ravilisetty | C04B 35/584 |
| | | | | 252/301.4 F |
| 2018/0185825 | A1 * | 7/2018 | Liao | B01J 37/348 |

OTHER PUBLICATIONS

Basic Research Needs for Microelectronics, Report of the Office of Science Workshop on Basic Research Needs for Microelectronics, Oct. 23-25, 2018, 138 pages.

Bonnot, A.M. et al., "Reactively Sputtered Zirconium Carbides, Carbonitrides and Nitrides Thin Films—Optical Properties," Solar Energy Materials, vol. 14, 1986, 10 pages.

Coltrin, M.E. et al., "Transport and breakdown analysis for improved figure-of-merit for AlGaN power devices," Journal of Applied Physics, vol. 121, 2017, 6 pages.

Dion, J. et al., "Structural Characterization of Highly Conducting AlGaN (x>50%) for Deep-Ultraviolet Light-Emitting Diode," Journal of Electronic Materials, vol. 40, No. 4, 2011, 5 pages.

Ding, K. et al., "Status of Growth of Group III-Nitride Heterostructures for Deep Ultraviolet Light-Emitting Diodes," Crystals, vol. 7, No. 300, 2017, 22 pages.

Francavilla, T.L. et al., "Superconducting Properties of Reactively Sputtered NbCN Thin Films," IEEE Transactions on Magnetics, vol. MAG-17, No. 1, Jan. 1981, 4 pages.

Hakamata, J. et al., "Growth of High-Quality AlN and AlGaN Films on Sputtered AlN/Sapphire Templates via High-Temperature Annealing," Phys. Status Solidi B, vol. 255, 2018, 5 pages.

Hoerling, A. et al., "Thermal stability, microstructure and mechanical properties of $Ti_{z-x}Zr_xN$ thin films," Elsevier Thin Solid Films, vol. 516, 2008, 11 pages.

Iba, Y. et al., "MOVPE growth of AlN films on nano-patterned sapphire substrates with annealed sputtered AlN," Elsevier Journal of Crystal Growth, vol. 532, 2020, 5 pages.

Kwon, H. et al., "Stability Domains of NbC and Nb(CN) During Carbothermal Reduction of Niobium Oxide," Journal of the American Ceramic Society, vol. 98, No. 1, 2015, 5 pages.

Mishima, A. et al., "Characteristics of AlN layer on four-inch sapphire substrate by high-temperature annealing in nitrogen atmosphere," Proceedings of SPIE, vol. 10532, 2018, San Francisco, CA, United States, 6 pages.

Miyake, H. et al., "Preparation of high-quality AlN on sapphire by high-temperature face-to-face annealing," Elsevier Journal of Crystal Growth, vol. 456, 2016, 5 pages.

Nagamatsu, K. et al., "Improved emission intensity of UVC-LEDs from using strain relaxation layer on sputter-annealed AlN," Japanese Journal of Applied Physics, vol. 58, 2019, 4 pages.

Naguib, M. et al., "Mxene: a promising transition metal carbide anode for lithium-ion batteries," Electrochemistry Communications, vol. 16, 2012, 4 pages.

Otani, S. et al., "Preparation of TaC Single Crystals by a Floating Zone Technique," Journal of Crystal Growth, vol. 55, 1981, 7 pages.

Park, J. S. et al., "Review-Group III-Nitride-Based Ultraviolet Light-Emitting Diodes: Ways of Increasing External Quantum Efficiency," ECS Journal of Solid State Science and Technology, vol. 6, No. 4, Q42-Q52, 2017, 12 pages.

Quesne, M.G. et al., "Carbon dioxide and water co-adsorption on the low-index surfaces of TiC, VC, ZrC and NbC: a DFT study," RSC Phys. Chem. Chem. Phys., vol. 21, 2019, 11 pages.

Seppanen, T. et al., "Magnetron sputter epitaxy of wurtzite $Al_{1-x}In_xN(0.1<x<0.9)$ by dual reactive dc magnetron sputter deposition," Journal of Applied Physics, vol. 97, 2005, 9 pages.

Seppanen, T. et al., "248 nm cathodoluminescence in $Al_{1-x}In_xN(0001)$ thin films grown on lattice-matched $Ti_{1-y}Zr_yN(111)$ seed layers by low temperature magnetron sputter epitaxy," Applied Physics Letters, vol. 89, 2006, 3 pages.

Uesugi, K. et al., "Fabrication of AlN templates on SiC substrates by sputtering-deposition and high-temperature annealing," Elsevier Journal of Crystal Growth, vol. 510, 2019, 5 pages.

Zhang, D. "Reliability Improvement of GaN Devices on Free-Standing GaN Substrates," IEEE Transactions on Electron Devices, vol. 65, No. 8, Aug. 2018, 9 pages.

Zhang, D. et al., "Erratum to Reliability Improvement of GaN Devices on Free-Standing GaN Substrates," IEEE Transactions on Electron Devices, vol. 66, No. 2, Feb. 2019, 1 page.

* cited by examiner

100

III-N HETEROEPITAXIAL DEVICES ON ROCK SALT SUBSTRATES

CROSS-REFERENCE TO RELATED APPLICATIONS

This application claims priority from U.S. Provisional Patent Application No. 63/139,528, filed on Jan. 20, 2021, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

SUMMARY

Described herein are rock salt substrates and methods of making thereof that are useful as epitaxial substrates for semiconducting materials, including ultra-wide bandgap materials. Advantageously, the described rock salt substrates may be useful as substrates for Group III (Al, Ga, In)—N substrate allowing for pseudomorphic growth of novel, desirable materials. The rock salt may be provided as a bulk material or deposited as a thin film. These substrates may allow for generation of high Al content semiconductor devices with ultra-wide bandgap and other useful properties.

In an aspect, provided is a device comprising: a semiconducting material comprising a transition metal and N, wherein the transition metal is selected from the group of Al, Ga, In or a combination thereof; and a rock salt substrate, wherein the semiconducting material is deposited on the rock salt substrate.

The semiconducting material may be lattice matched to the rock salt substrate. The semiconducting material may be deposited on the rock salt substrate via heteroepitaxy. The semiconducting material may be face-to-face annealed to the rock salt substrate.

The rock salt substrate may comprise a transition metal nitride, transition metal carbide or a transition metal carbonitride. The rock salt substrate may be selected from the group of TaC, TaN, NbN, NbC, ZrN, ZrC, ScC, ScN, HfN, HfC, an alloy thereof or a combination thereof. The rock salt substrate may be TaC, TaN, ZrN, alloys thereof or a combination thereof.

The semiconducting material may have an Al concentration selected from the range of 30% to 80%, 30% to 70%, 40% to 80%, 30% to 60%, 40% to 70%, 40% to 60% or optionally, 35% to 70%. The semiconducting material may be defined by the formula $Al_xGa_{1-x}N$, wherein x is selected from the range of 0.3 to 0.8, 0.3 to 0.7, 0.4 to 0.8, 0.3 to 0.6, 0.4 to 0.7, 0.4 to 0.6, or optionally, 0.35 to 0.7.

The device may be an ultra-wide bandgap semiconductor. The semiconducting material and the rock salt substrate may have a lattice constant selected from the range of 3.0 to 3.2 angstroms, 3.1 to 3.2 angstroms, 3.1 to 3.17 angstroms, 3.13 to 3.2 angstroms, or optionally, 3.13 to 3.17 angstroms.

The rock salt substrate may comprise a transition metal nitride, transition metal carbide or a transition metal carbonitride film deposited on a $Al_2O_3$, SiC, or MgO substrate, for example, sapphire.

In an aspect, provided is an epitaxial substrate comprising: a high-temperature substrate; and a carbonitride layer a transition metal cation and N, C or a combination thereof, wherein the epitaxial substrate is face-to-face annealed.

The carbonitride film may comprise two or more transition metal cations. The transition metal may be selected from the group Ta, Nb, Sc, Hf, Zr or a combination thereof.

The carbonitride layer may have a thermodynamic ground state of rock salt. The high-temperature substrate may be selected from the group of $Al_2O_3$, SiC, or MgO. The carbonitride layer may be a bulk rock salt material or a thin film.

In an aspect, provided is a method of making the device or epitaxial substrate as described herein.

BRIEF DESCRIPTION OF DRAWINGS

Some embodiments are illustrated in referenced figures of the drawings. It is intended that the embodiments and figures disclosed herein are to be considered illustrative rather than limiting.

vertical devices with >30% AlGaN, HT Transistor, high power transistor, polarized grading.

Figure 12:
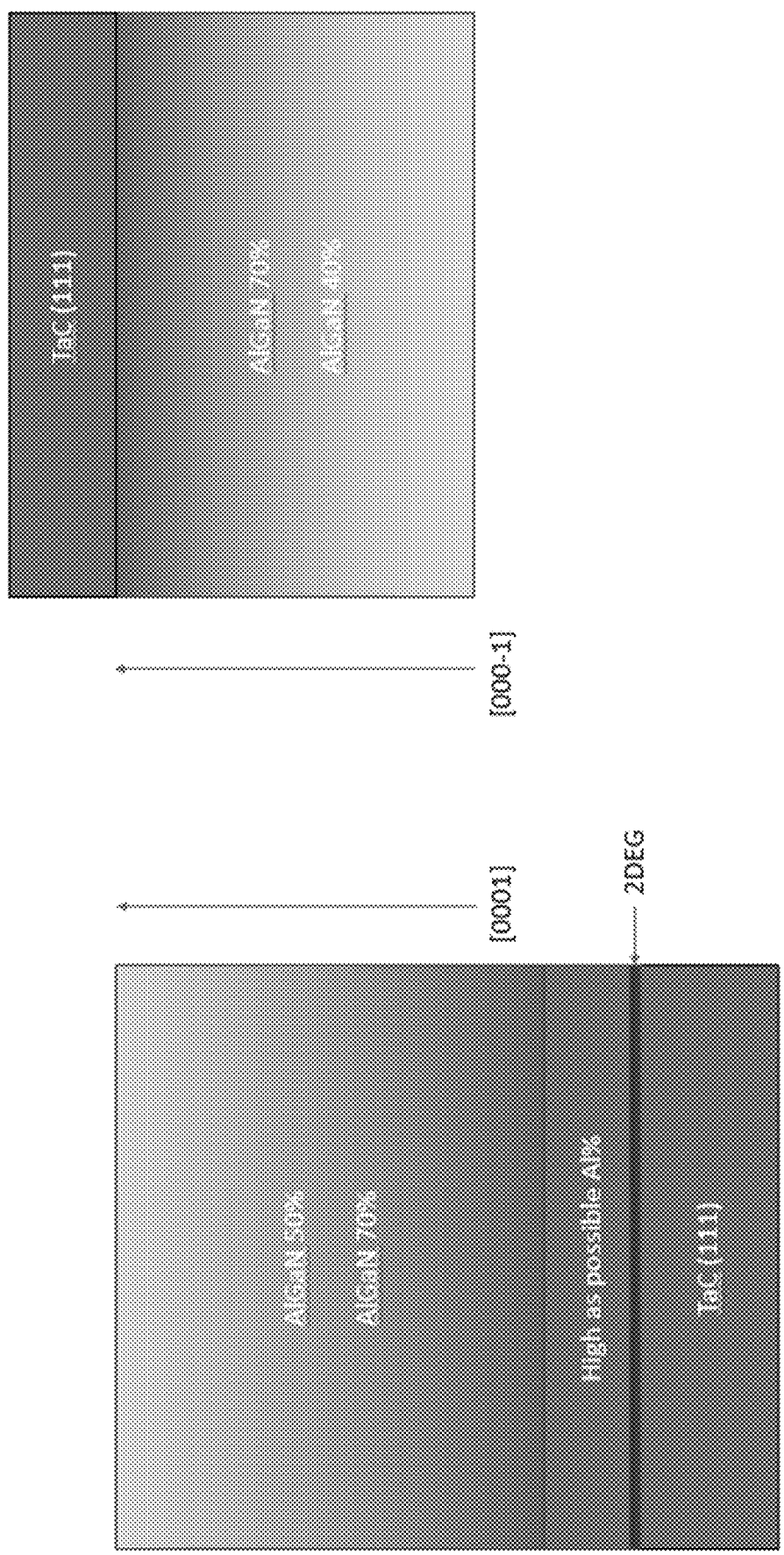

FIG. 12 illustrates contact at the RS-WZ interface.

Figure 13:
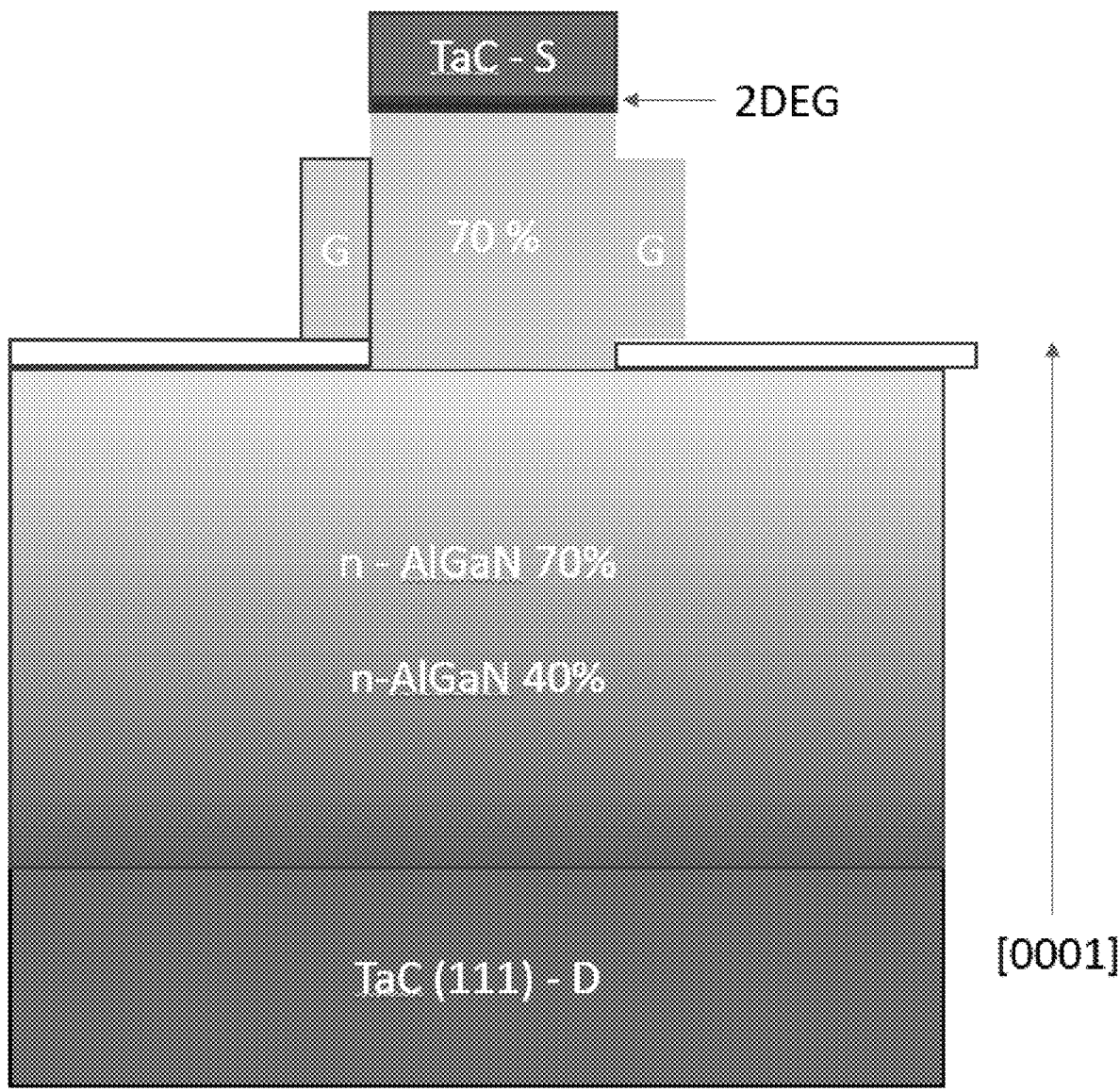

FIG. 13 provides an example unipolar electron device. This may provide good n-type contact at the TaC/70% AlGaN interface and may generate a second degree to facilitate transport. Other rock salt materials may also be useful in this application.

Figure 14:
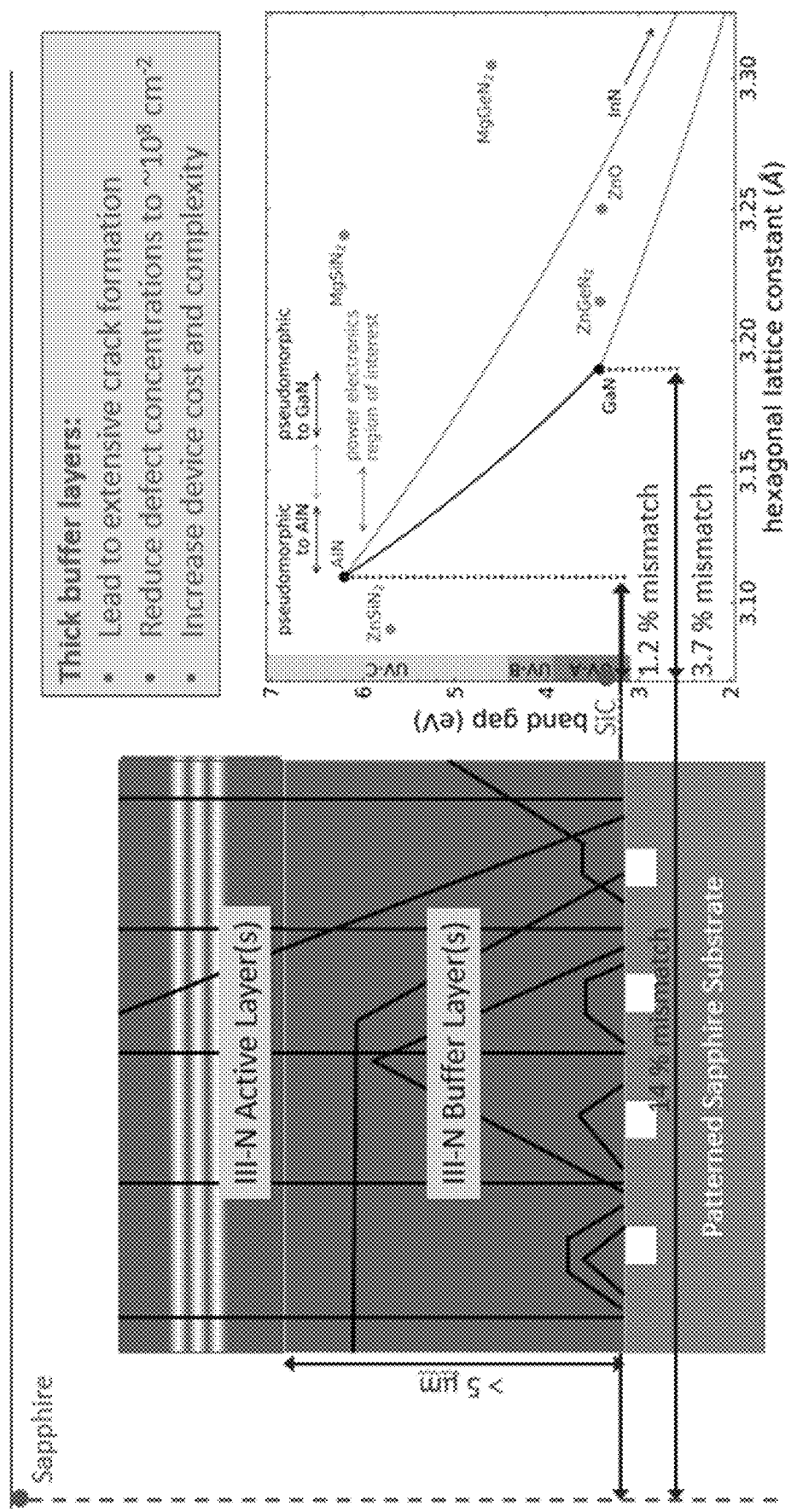

FIG. 14 illustrates how mismatched substrates may lead to buffer layer engineering.

Figure 15:
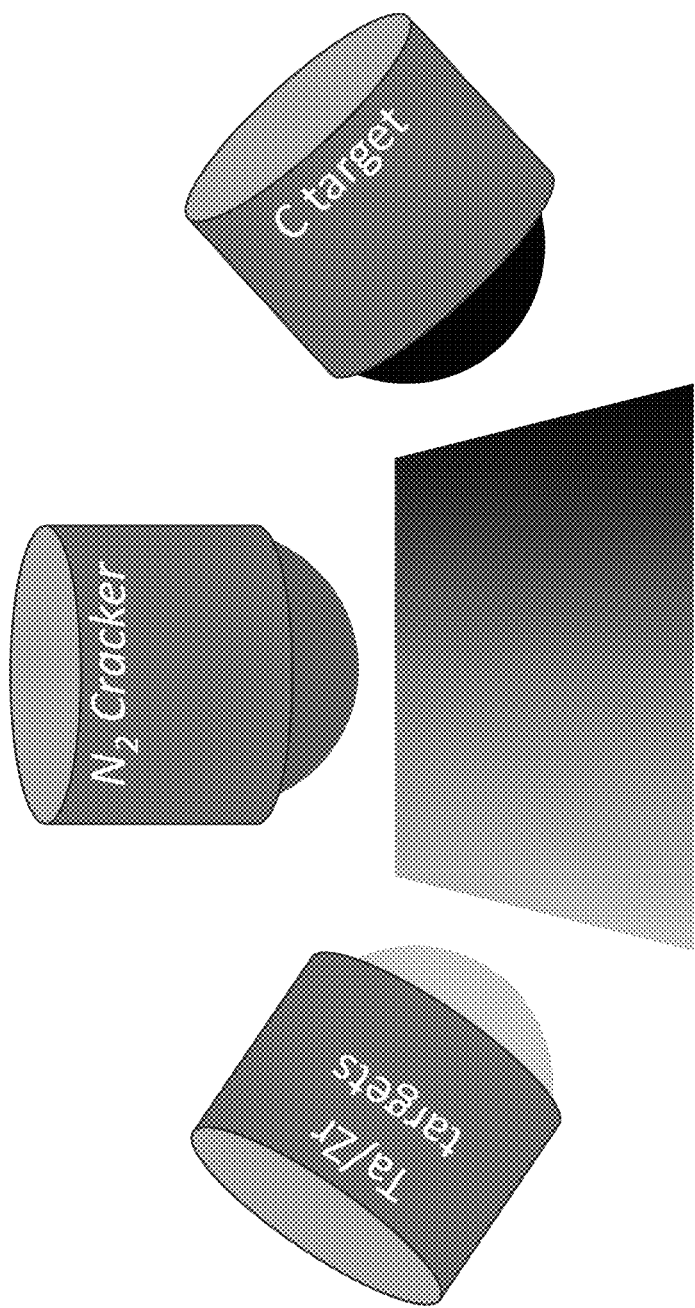

FIG. 15 provides an exemplary combinatorial RF sputtering device.

Figure 16:
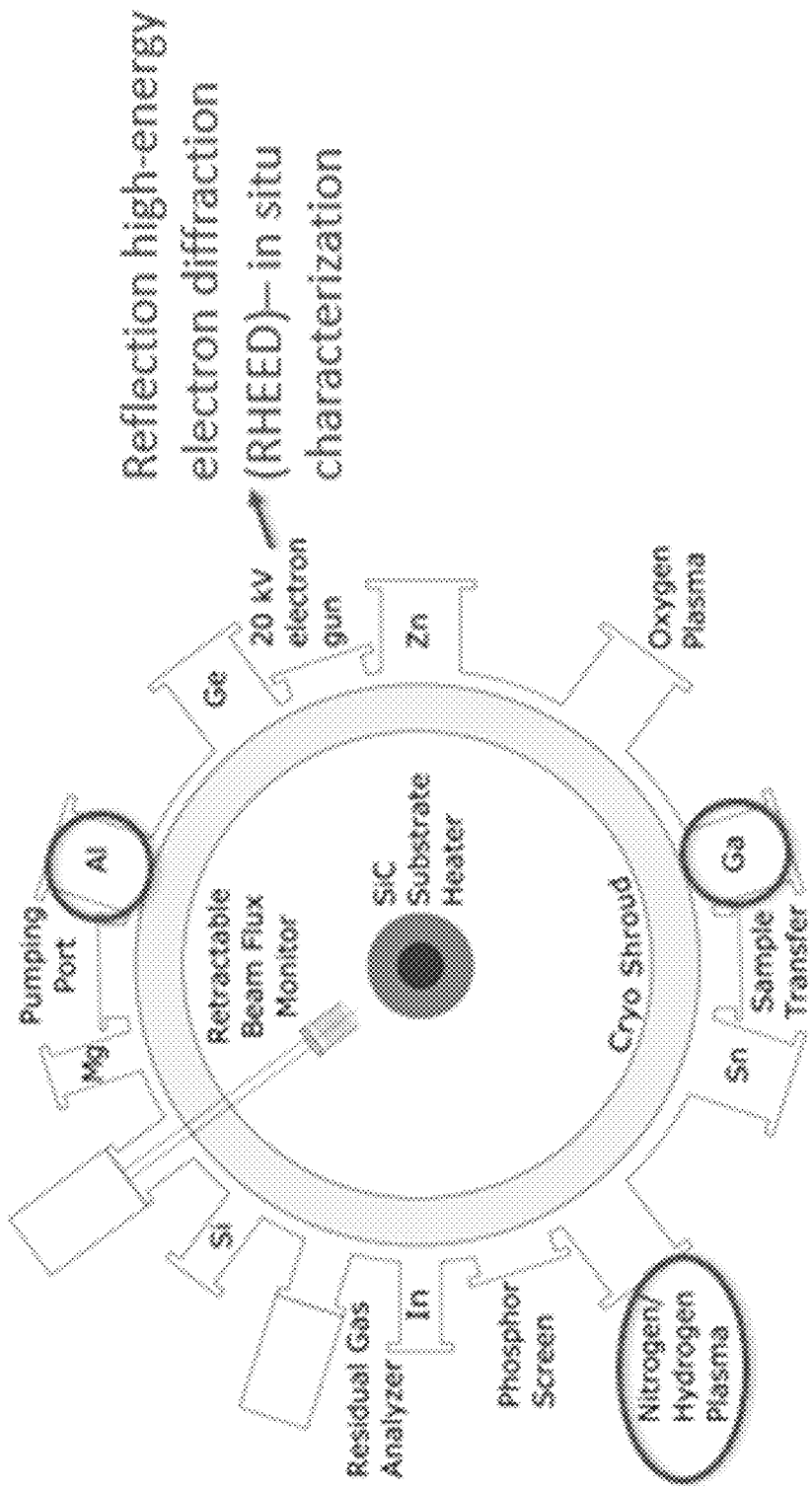

FIG. 16 provides an exemplary molecular beam epitaxy (MBE) device.

Figure 17A:
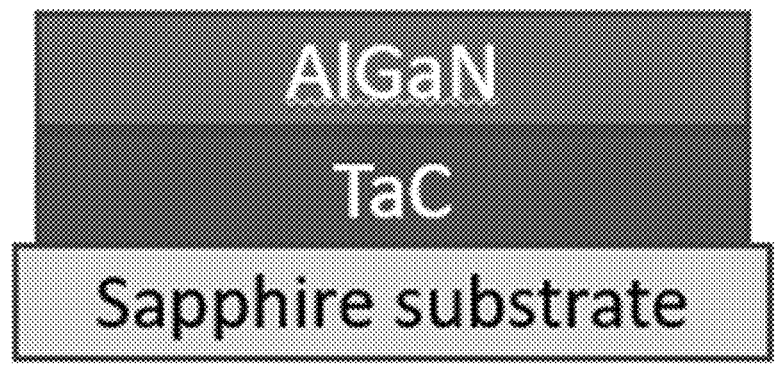
Figure 17B:
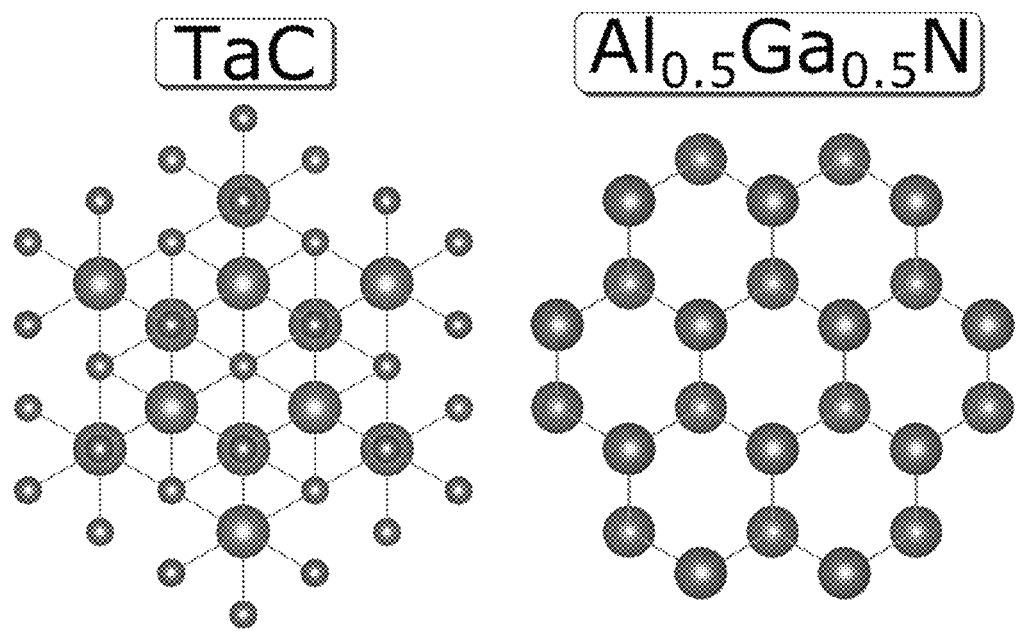

FIGS. 17A-17B provides a growth schematic of transition metal carbonitride virtual substrates (FIG. 17A) and the crystal lattice (111) substrate plane and AlGaN (FIG. 17B). In FIG. 17A the TaC layer is deposited via sputtering and the AlGaN layer is deposited via molecular beam epitaxy (MBE). These figures illustrate that the 111 hexagonal face of the rock salt crystal can be preferentially stabilized by depositing on a hexagonal substrate, for example, sapphire.

Figure 18A:
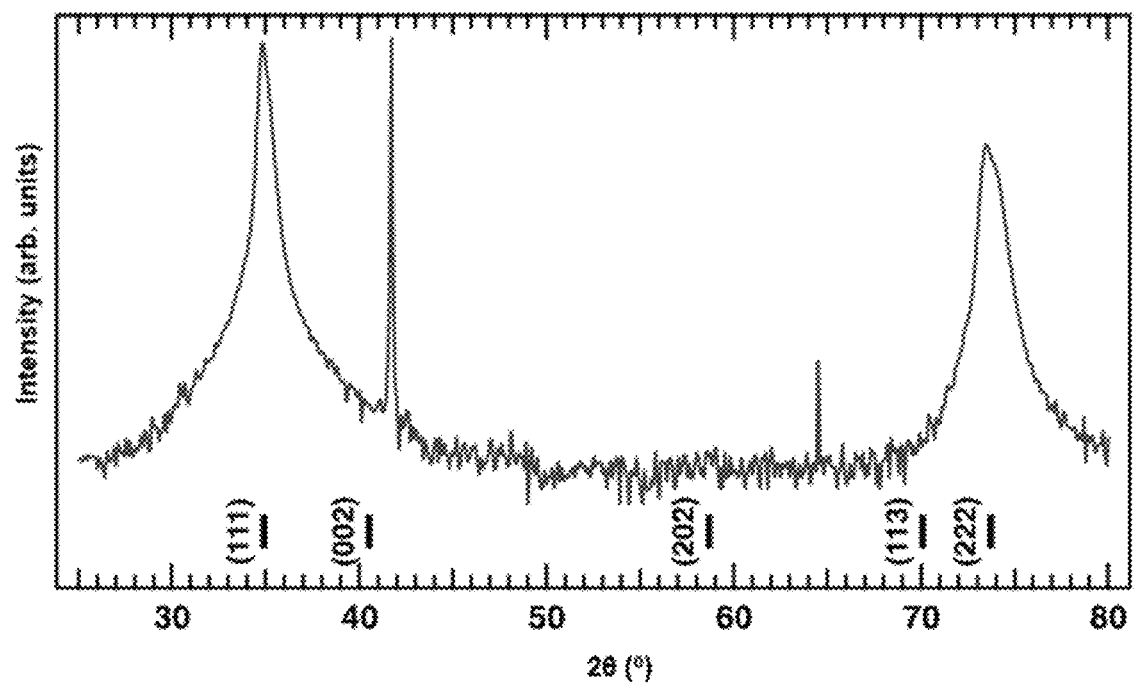
Figure 18B:
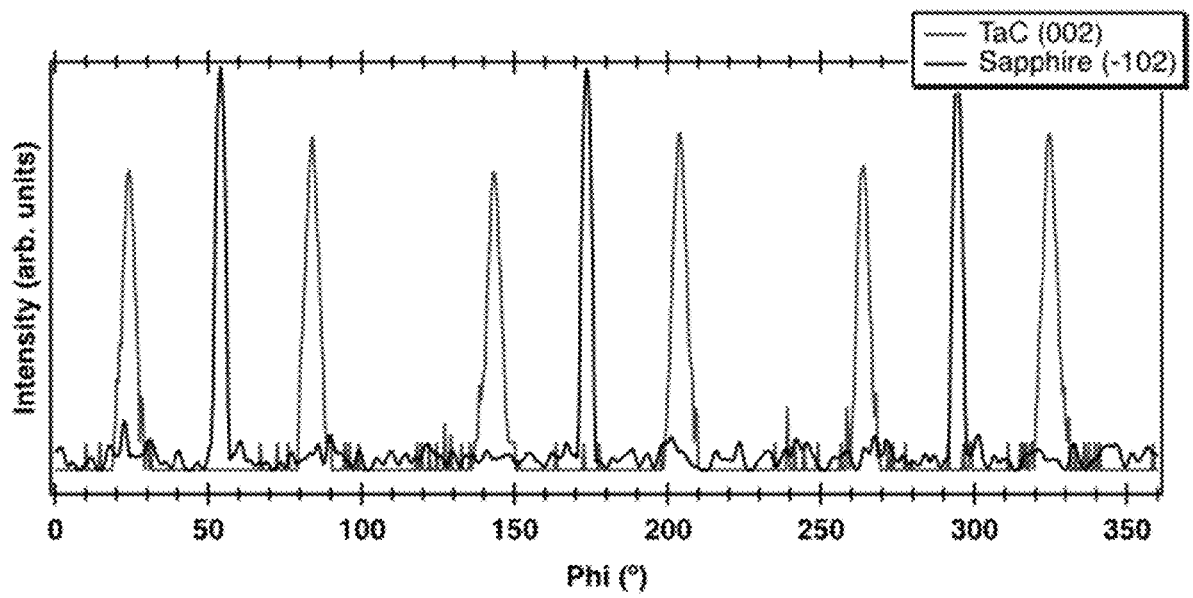

FIGS. 18A-18B. FIG. 18A shows the X-ray diffraction (XRD) pattern of sputtered TaC film showing aligned (111) planes. FIG. 18B provides a Phi scan indicating alignment with oxygen sublattice of the sapphire substrate.

Figure 19A:
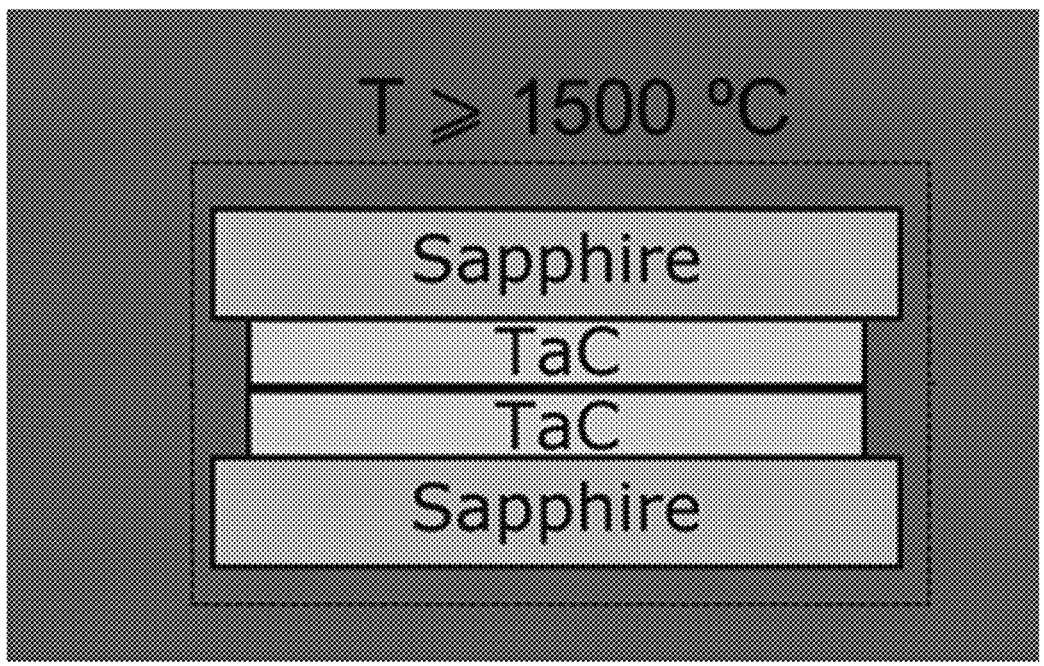
Figure 19B:
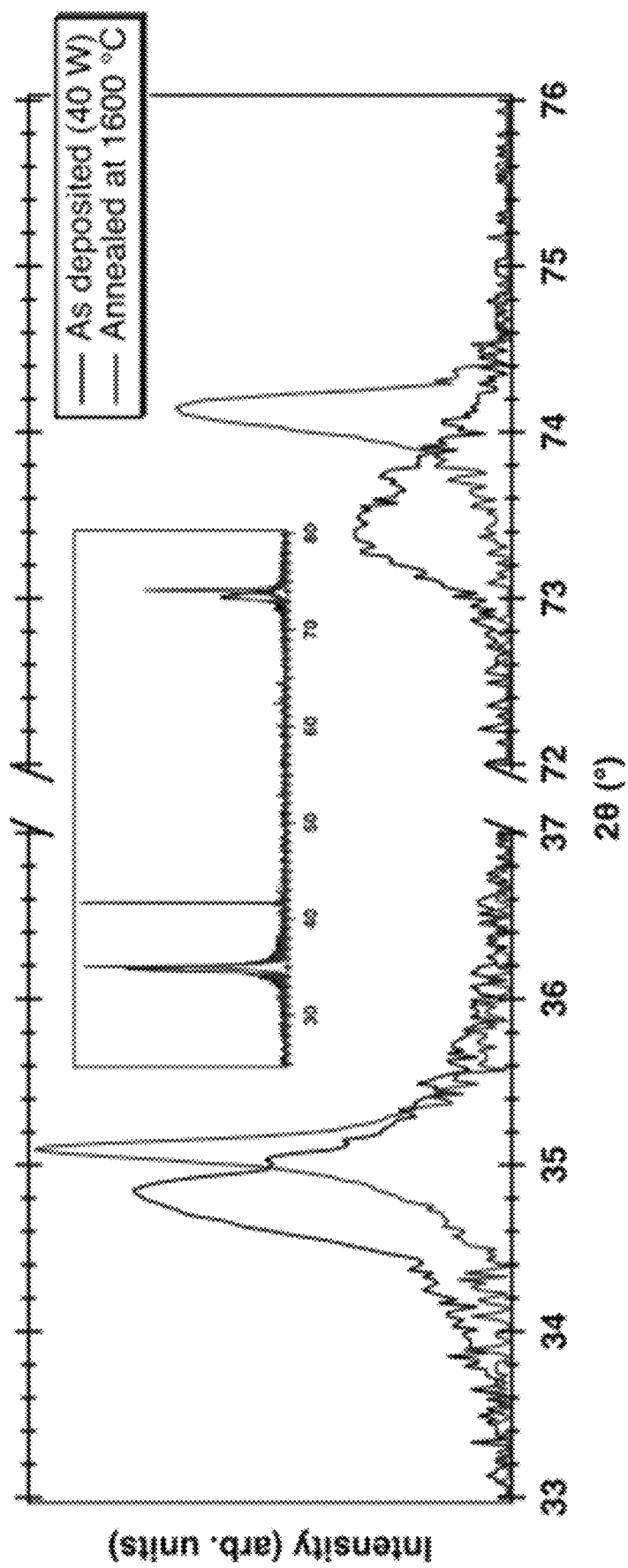

FIGS. 19A-19B. FIG. 19A provides a face-to-face annealing schematic and FIG. 19B shows the XRD pattern comparing the structure of a sample as-deposited and after being annealed at 1600° C. for three hours. The presence of sharper peaks without shoulders indicates higher crystallinity TaC.

Figure 20A:
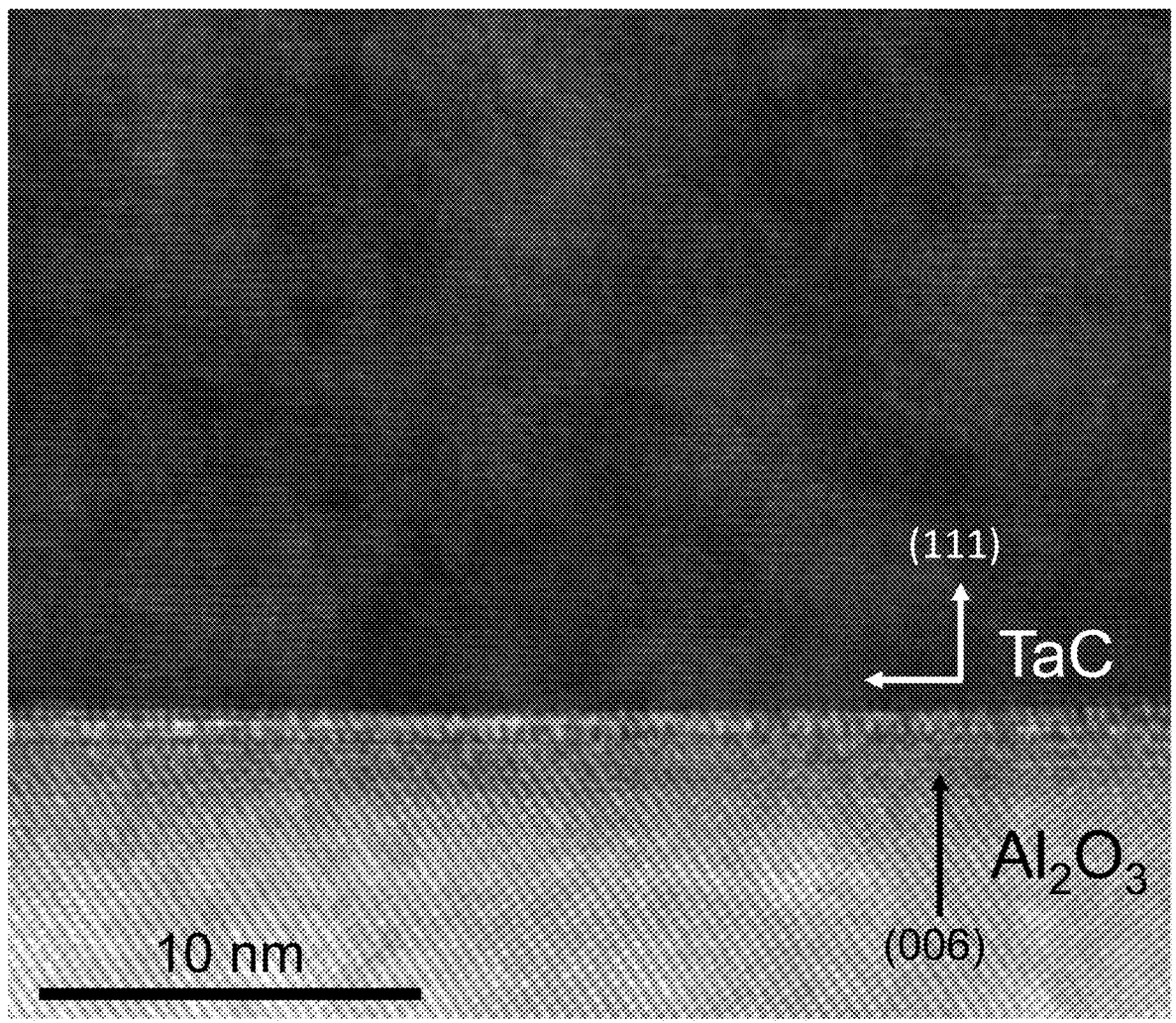
Figure 20B:
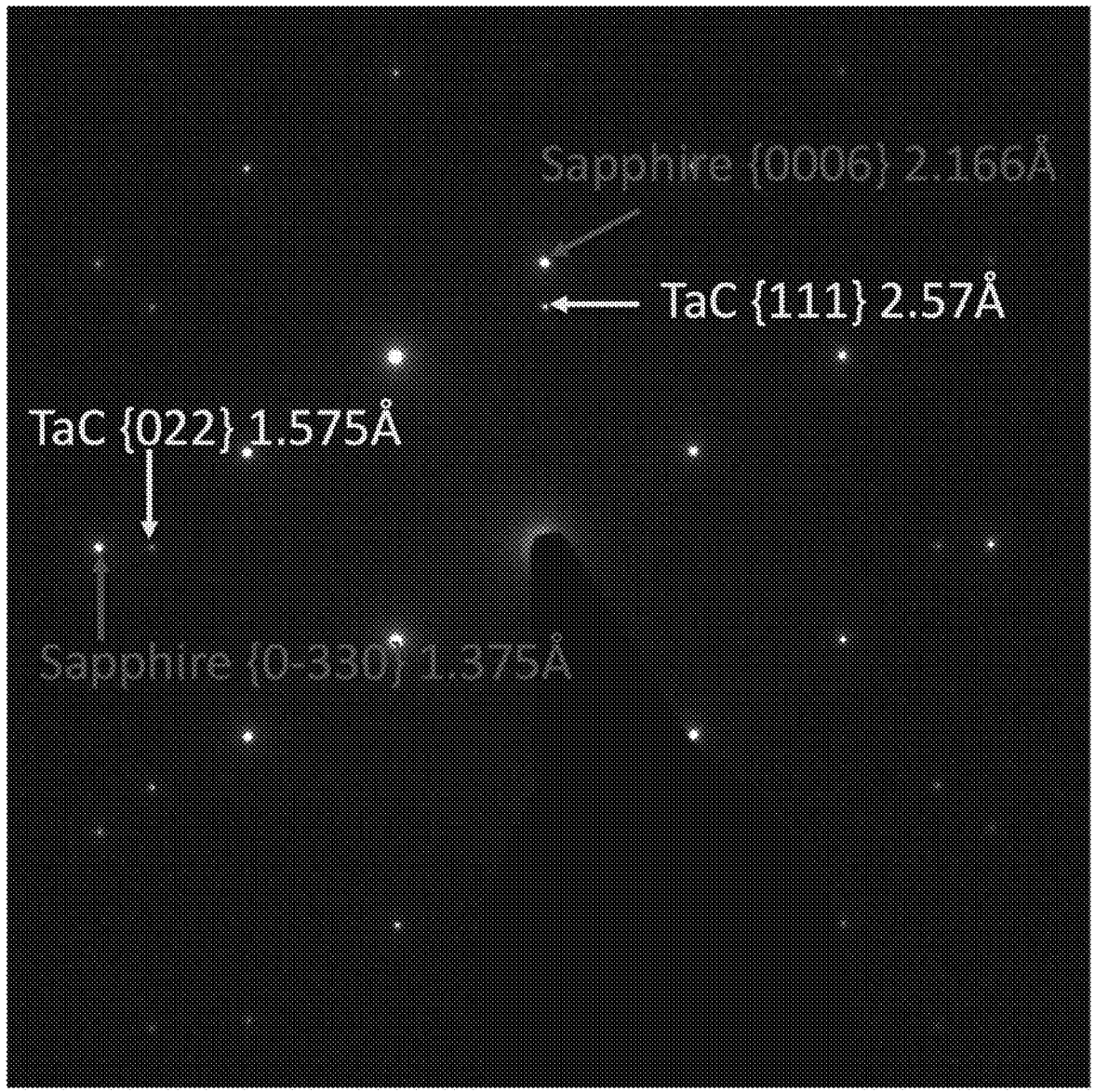

FIGS. 20A-20B. FIG. 20A provides a high resolution transmission electron micrograph (TEM) showing atomic alignment between the sapphire ($Al_2O_3$) substrate and grown TaC layer. FIG. 20B provides selective area electron diffraction (SAED) pattern illustrating the epitaxial relationship between sapphire and TaC.

Figure 21:
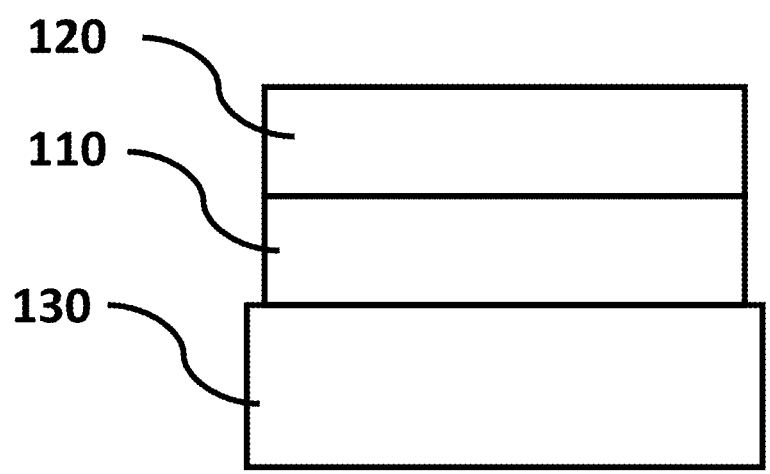

FIG. 21 provides an exemplary schematic of the devices described herein.

REFERENCE NUMERALS

100 Device
110 Rock salt substrate
120 Semiconducting material
130 High-temperature substrate

DETAILED DESCRIPTION

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The provided discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

FIG. 21 illustrates an example of a device 100 described by the present disclosure. A rock salt substrate 110 may be used to epitaxially grow a semiconducting material 120, including for example, via molecular beam epitaxy. In some embodiments, the rock salt substrate 110 is deposited (e.g., via sputtering) on a high-temperature substrate 130 and may be annealed in order to increase material properties such as crystalline quality.

Example 1—Lattice-Matched (Al, Ga, In)N Devices Grown on Bulk (111) TaC Substrates Described herein are lattice-matched (Al, Ga, In)N devices grown on bulk (111) TaC substrates. These include high electron mobility transistors (HEMTs), current aperture vertical electron transistors (CAVETs), and deep-ultraviolet (DUV) optoelectronics including light-emitting diodes (LEDs). An aspect of the devices and methods described herein is the similarity of the crystalline lattice of TaC, when sliced along the (111) face, and high-Al content (Al, Ga)N (0001 face) where Al-content is in the range 40-60%.

There remains a need in the art for strained (pseudomorphic) or lattice-matched growth of (Al, Ga, In)N materials in the range 3.13 angstroms to 3.17 angstroms. Specifically, this range of lattice constants (30% Al-70% Al in the AlGaN alloy system, without considering In-alloying) is highly useful for both power electronics applications and DUV optoelectronics. The range 50%-70% Al-content in the AlGaN system is considered the most applicable for power electronics because (1) the bandgap is high enough to offset alloy scattering when compared to GaN power electronics and (2) it is within a range where n-type doping is still feasible. Bulk AlN and free-standing pseudo-bulk GaN substrates are available commercially, but are (1) not scalable, (2) prohibitively expensive, and (3) still not lattice-matched to this composition of AlGaN. In addition, DUV optoelectronics often fail to exceed 1% efficiency due to defects created by lattice-mismatched growth on GaN or AlN substrates, and the efficiency of such devices improves when grown on lattice-matched substrates as described herein.

Additionally, TaC is closely matched to AlGaN in thermal expansion coefficient, which provides an improvement over SiC or sapphire substrates—the process of cooling the films down after growth introduces strain and defects if the materials contract at different rates.

A similar range of devices include bulk AlN substrates and free-standing pseudo-bulk GaN substrates. Both are prohibitively expensive and non-scalable. Both are not in the ideal lattice constant range, therefore cannot provide lattice-matched growth of high Al-content AlGaN in the 30% to 70% range (or an alloy with In in the same lattice constant range).

Example 2—Substrates by Design: Enabling Low-Cost Wide Bandgap Semiconductor Epitaxy Ultra-wide bandgap (UWBG) semiconductors are important for next-generation technologie—power electronics, deep-UV (DUV) optoelectronics, high temperature electronics, and GHz+communication are all reliant upon the next generation of UWBG materials. The extension of GaN electronics to higher band gaps through alloying with AlN is important for all use-cases of UWBG materials. For power electronics, low-frequency performance scales linearly with carrier mobility ($\mu$) and critical field cubed ($E_C^3$) which itself is an exponential function of band gap. Thus, UWBG materials are highly coveted for their power handling capabilities. For $Al_xGa_{1-x}N$, there are competing effects of alloy scattering (decreased mobility) and increased bandgap, such that higher performance than GaN requires $x \gtrsim 0.5$. On the other hand, n-type doping becomes difficult in AlGaN at $x > 0.85$, leading to a composition "sweet spot" of approximately 50%-80% Al for effective power electronics. This region is depicted by a titled arrow in lattice constant space in FIG. 1. For DUV applications, AlGaN emitters show poor external quantum efficiency (EQE<1-10%) because of high threading dislocation densities (TDDs) due to foreign substrates and the lack of efficient p-type doping. Increasing the EQE of AlGaN optoelectronics is the focus of significant research dollars due to the demand for efficient UV emitters in a variety of fields.

Figure 1:
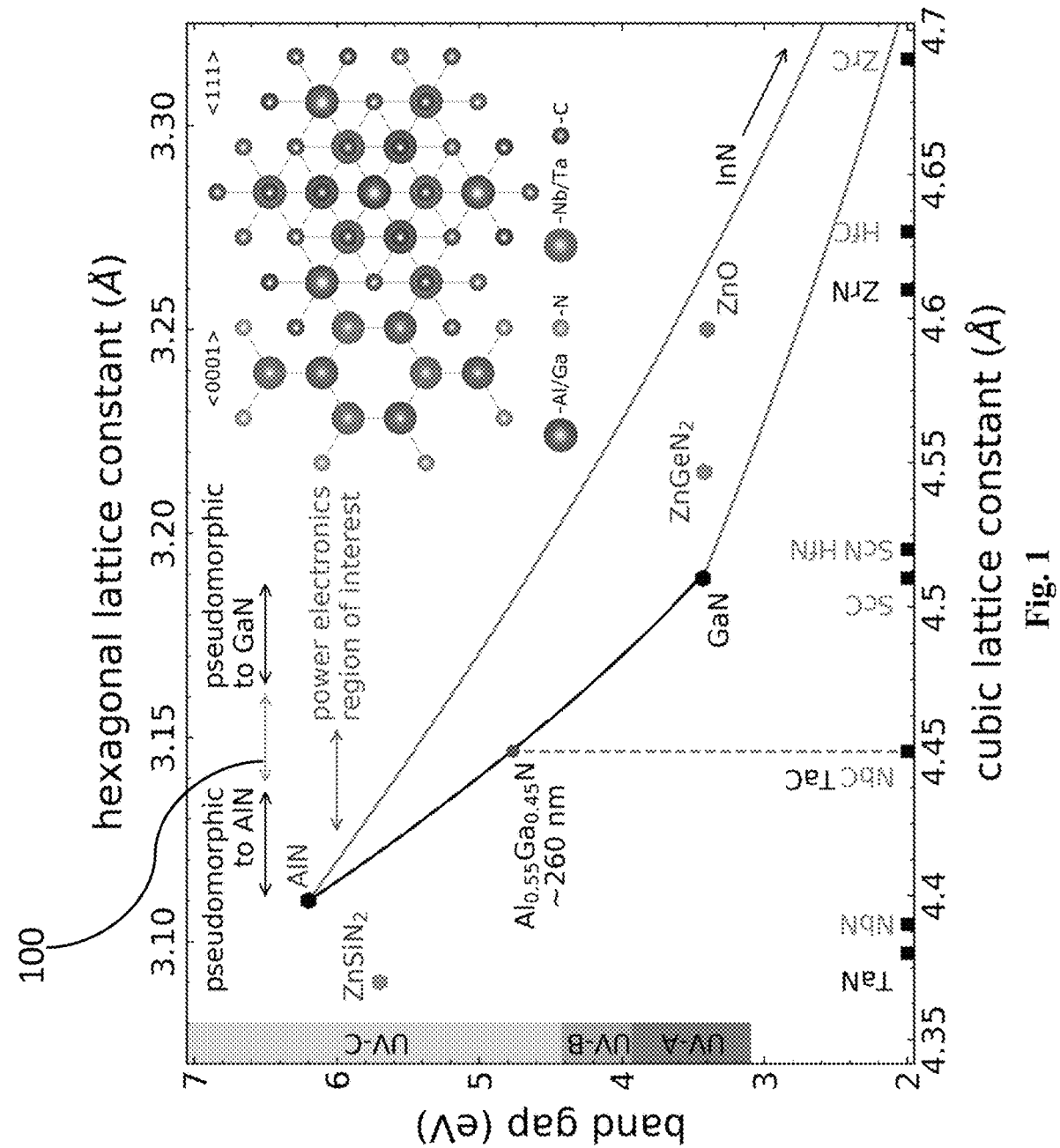
FIG. 1 provides lattice-constants of rock salt transition metal carbides and nitrides compared to UWBG materials of, focused on AlGaN. The arrow 100 represents "no man's land", the region of AlGaN composition space where pseudomorphic growth is not yet possible. Inset: $Al_{0.55}Ga_{0.45}N$ is lattice-matched to (111) NbC and TaC. The growth direction is out-of-plane, the layers are displaced horizontally for clarity.

It is generally accepted that lattice-matched substrates significantly increase material quality and device efficiency for any epitaxial semiconductor material. Free-standing GaN and bulk AlN substrates have enabled significant advances in device performance, however they are prohibitively expensive. A low-cost lattice-matched substrate could revolutionize UWBG III-N devices. Even when bulk substrates are used, pseudomorphic growth of $Al_xGa_{1-x}N$ is only possible for $x < 0.4$ and $x > 0.65$. These regions are shown in FIG. 1, along with a region where pseudomorphic growth is currently impossible (arrow 100). Note the overlap with the power electronics region of interest. Described herein are methods to create high quality epitaxial substrates for AlGaN in the power electronics region of interest.

Figure 2:
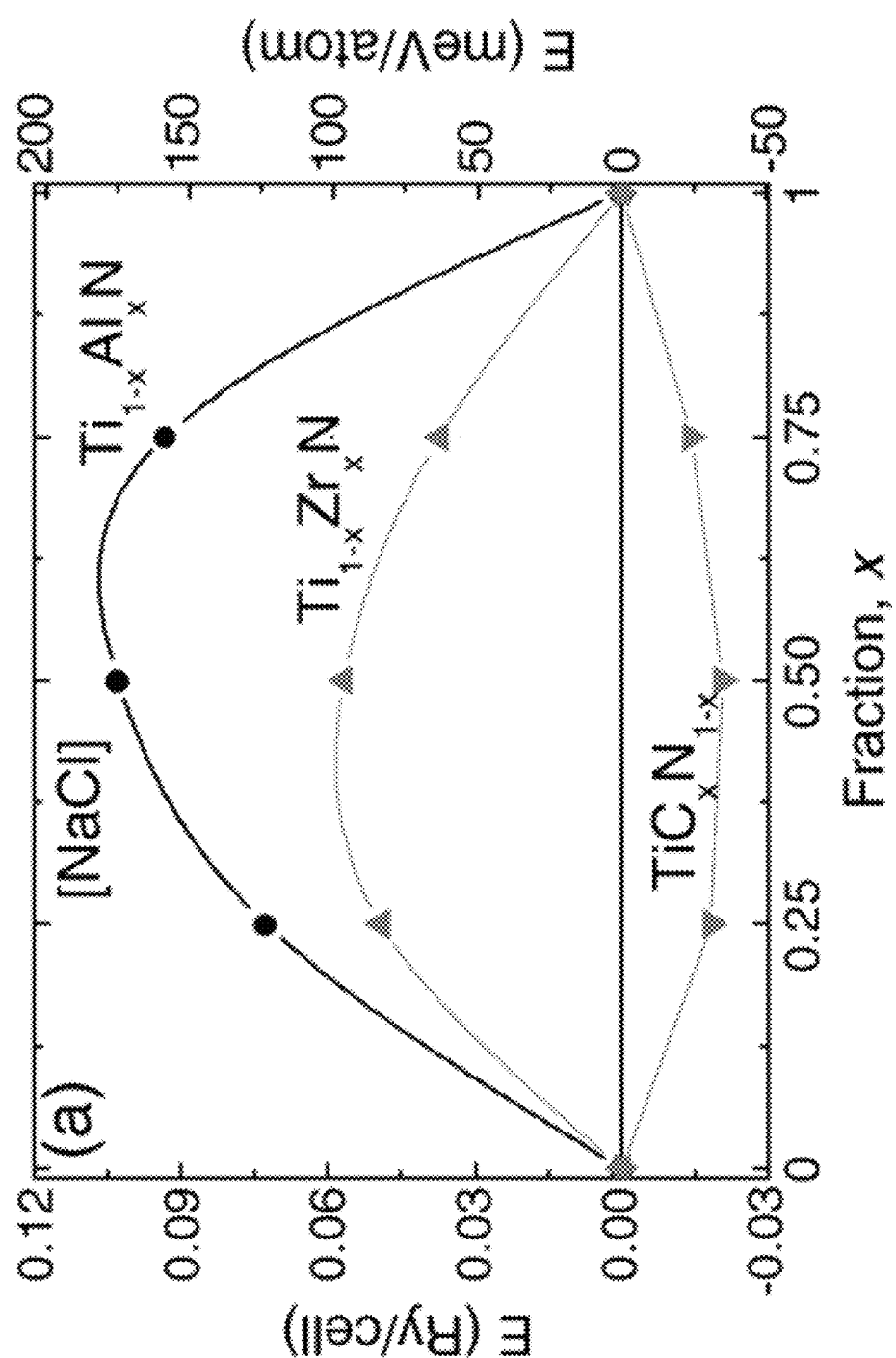
FIG. 2 provides calculated formation energies of rock salt alloys (Ti,Al)N, (Ti,Zr)N, and Ti(C,N). Cation alloys show a spinodal decomposition region, while the carbonitride contains thermodynamically stable ordered compounds along a convex hull.

Transition metal nitrides (TMNs) and carbides (TMCs) of group IV and V transition metals crystallize in the rock salt structure Fm3̄m. These compounds are traditionally investigated for high melting points, high values of Young's modulus, corrosion resistance, and extreme hardness where they have found use in tool coatings and steel alloys. In addition to polycrystalline samples, TMNs, TMCs, and alloys between the two can be deposited in highly crystalline and sometimes epitaxial thin film form. The (111) plane in rock salt structures is perfectly hexagonal with a lattice constant $$a_{hex} = \frac{a}{\sqrt{2}}$$

and for TMCs and TMNs span the family of interesting wurtzite compounds with hexagonal spacings that range from 2.92 Å to 3.44 Å (see FIG. 1). In addition, it is possible to form ordered carbonitride compounds along the composition range. Due to their similar size, the substitutional difference between C and N is very low, leading to a low volume and lattice change upon alloying. Additionally, both TMCs and TMNs can form C- or N-poor compounds with ordered vacancies that alter their properties significantly. This tendency to form an ordered sublattice, along with the low diffusivity of C and N, leads to the formation of carbonitride structures as shown in FIG. 2.

Recently, there has been work on face-to-face annealed sputtered AlN substrates, where AlN is sputter deposited on sapphire and face-to-face annealed at 1600° C.-1700° C. in a $N_2$ atmosphere. The high temperature annealing (HTA) process is shown to recrystallize the deposited AlN layer to near-bulk crystallinity, allowing the growth of AlN and AlGaN layers at higher quality than is currently available on foreign substrates. Additionally, either SiC or sapphire substrates may be used, and the process is scalable (up to 4" currently) based on available substrate size. Despite these advances, there are no benefits for the AlGaN power electronics region of interest due to the same lattice-mismatch issue. Exemplified in FIG. 1, the TMCs and TMNs allow lattice-matching to points along the entire (Al, In, Ga)N alloy range, including regions of interest for power electronics, DUV optoelectronics, and green/yellow optoelectronics. In addition, other interesting UWBG materials can be epitaxially accessed. Described herein is the use of TaC, ZrN, and (TaC$_x$N$_{1-x}$) materials for face-to-face annealed epitaxial substrates, enabling the goal of low-cost high quality epitaxy across the III-N alloy range.

TMNs and TMCs are applied via sputter deposition using a chamber that is equipped with a N$_2$ cracker and is already used to sputter carbides. Sapphire substrates, as well as deposition conditions, are used to control the orientation of the deposited film to the desired (111) plane. Combinatorial depositions, where the deposition conditions are controllably varied across the wafer surface, are used to develop ideal deposition conditions. Combinatorial depositions are also be used to interrogate the C—N alloy system.

Figure 3:
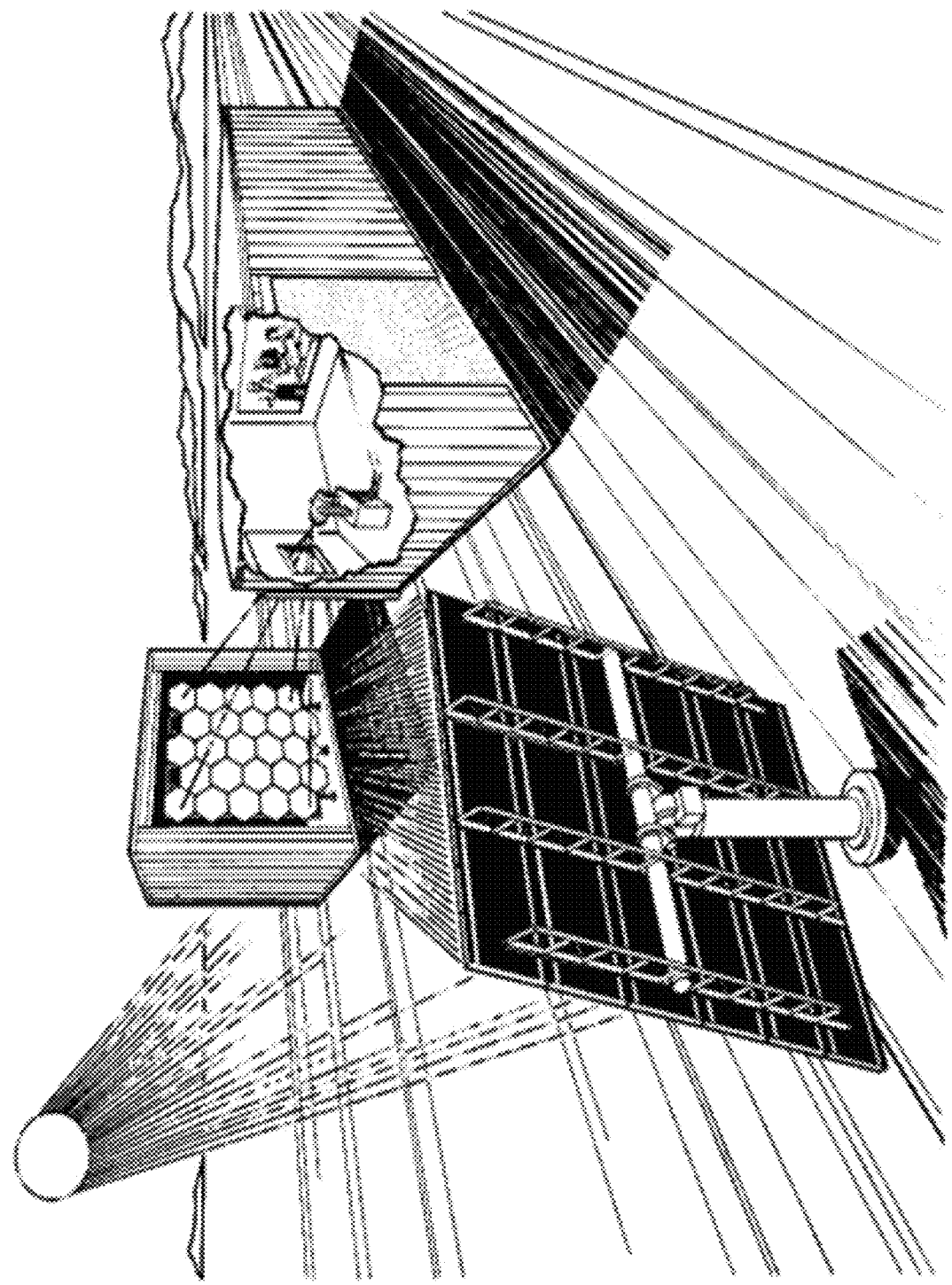
FIG. 3 provides a diagram of the High-Flux Solar Furnace facility, a 10 kW optical furnace capable of generating 250 $W/cm^2$ with primary focusing optics (hexagonal mirror array), providing annealing temperatures in excess of 2000° C.
Figure 4:
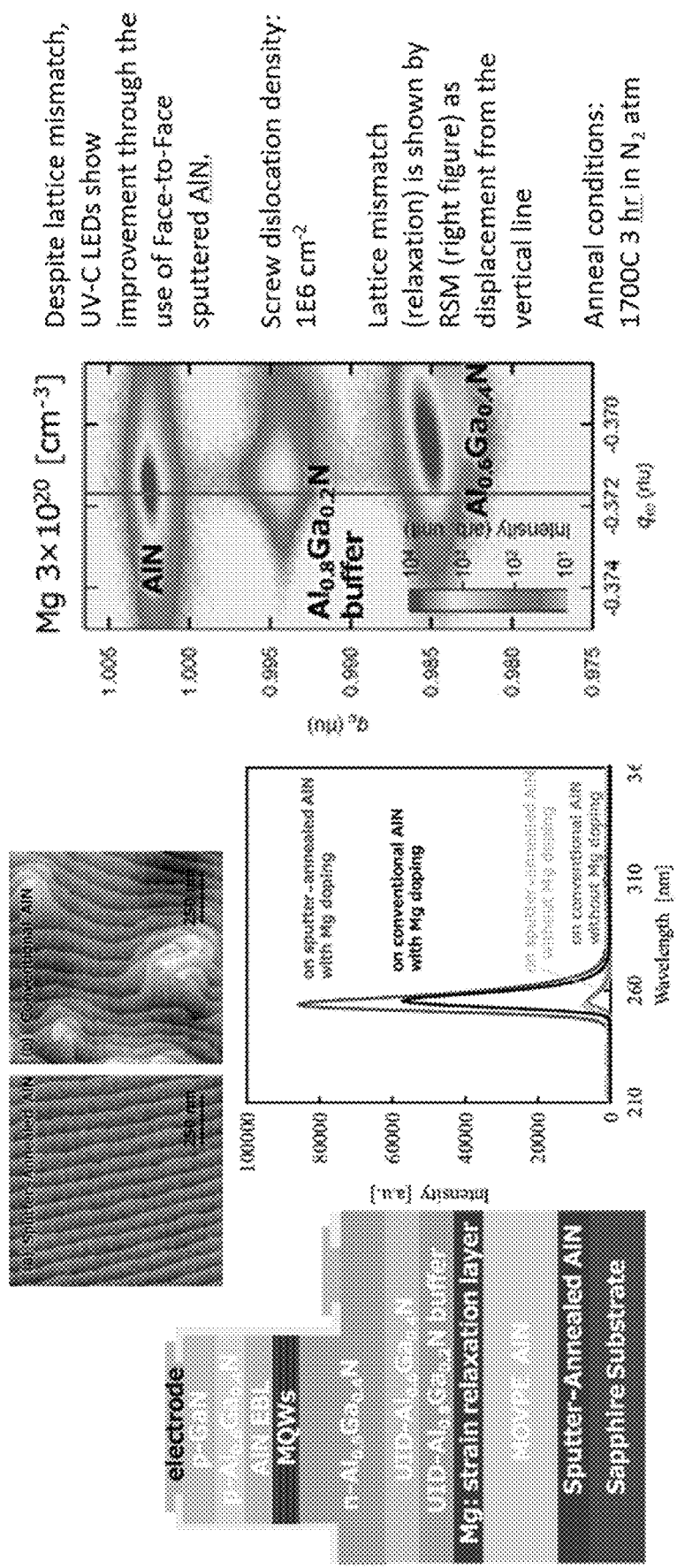
FIG. 4 provides an example of Face-to-Face Annealed Sputtered AlN, known in the art.
Figure 5:
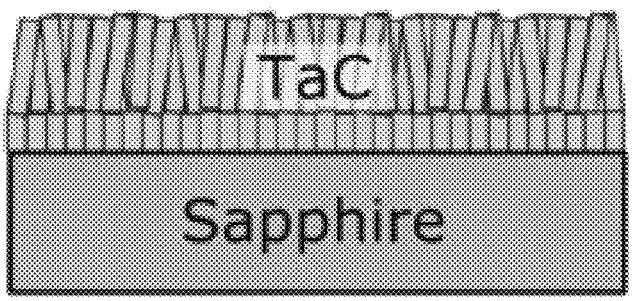
FIG. 5 provides an example process flow. (1) Sputter deposition of (111) oriented TaC (the project scope also includes TaN and $TaC_xN_{1-x}$) on sapphire. (2) High temperature annealing to recrystallize the sputter deposited films into substrate-quality template layers. (3) Heteroepitaxial growth of UWBG AlGaN on the annealed template using molecular beam epitaxy (MBE).
Figure 5:
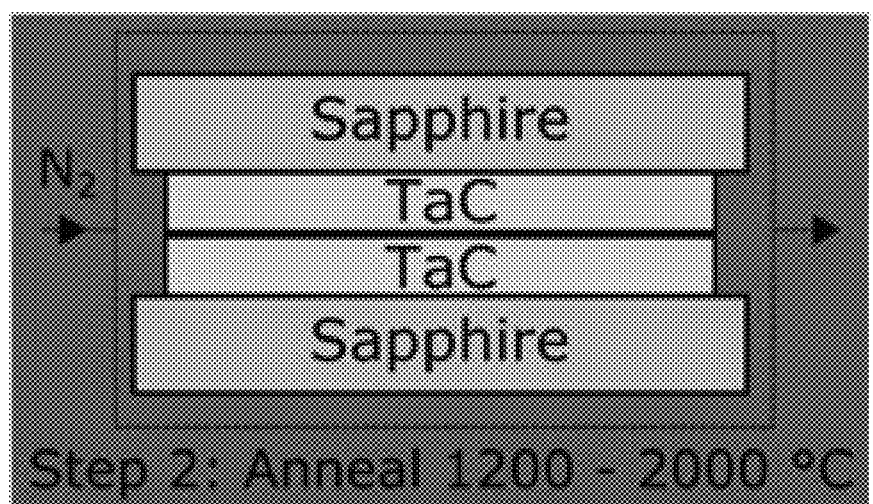
Figure 5:
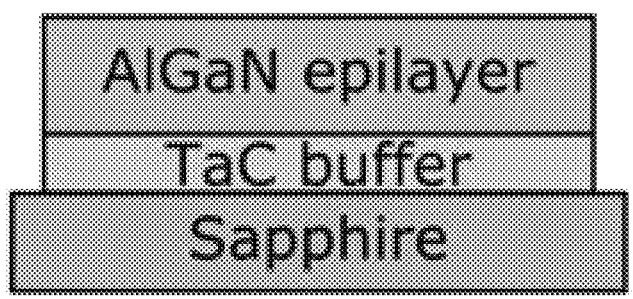
Figure 6:
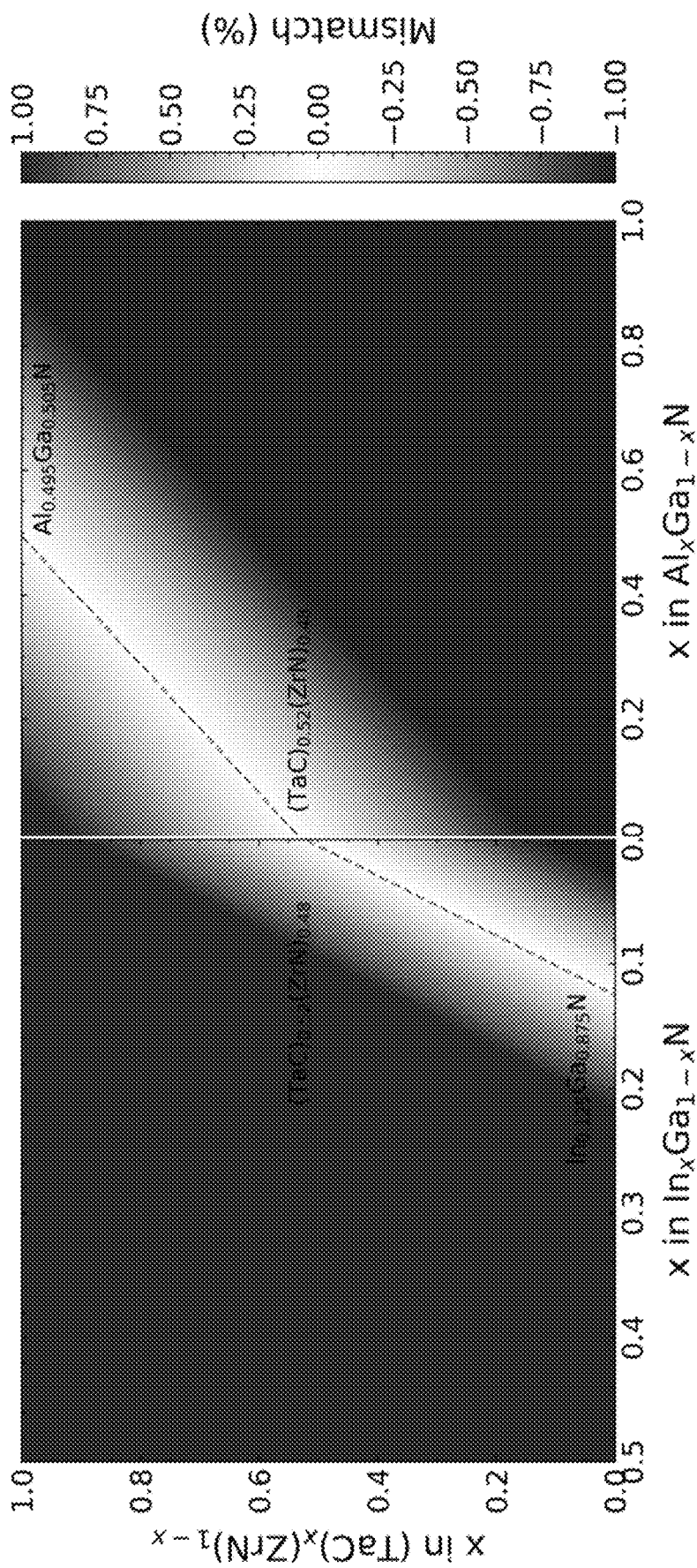
FIG. 6 illustrates lattice matched compounds at room temperature.
Figure 7:
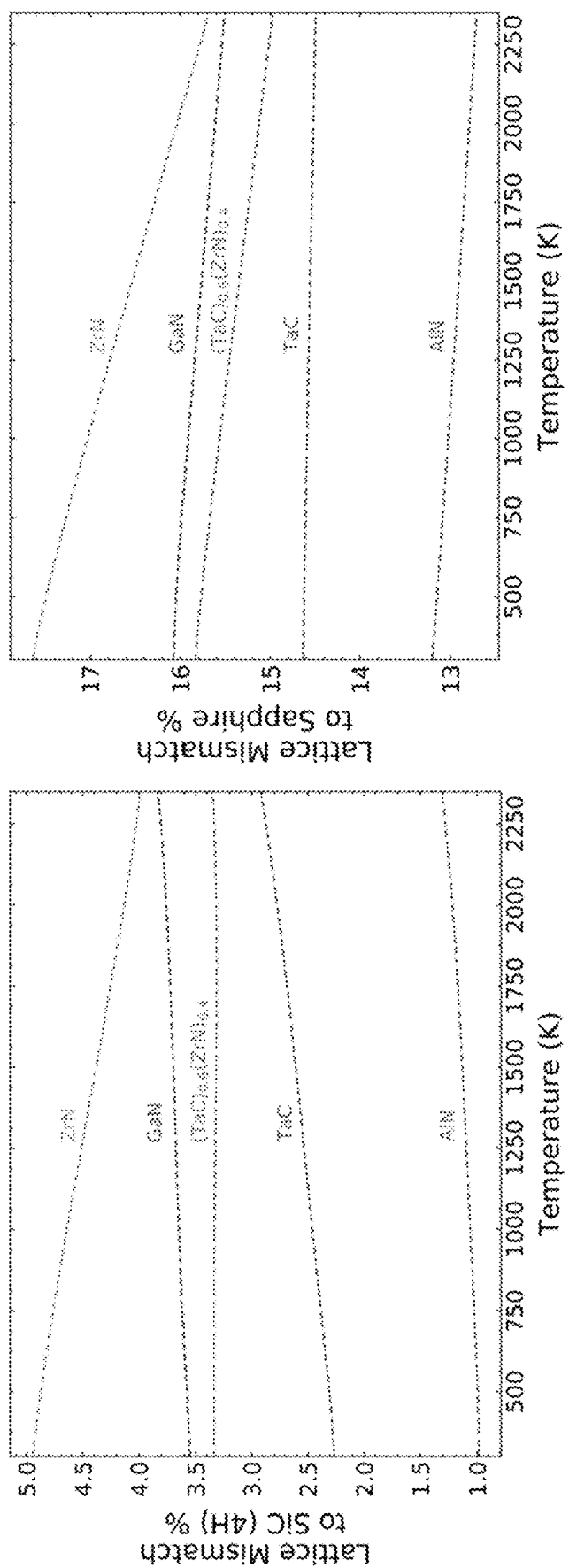
FIG. 7 describes Thermal mismatch to $Al_2O_3$ and SiC. $(TaC)_{0.6}(ZrN)_{0.4}$ CTE is approximately equal to that of SiC from 200-2000K. Vegard lattice constant close to GaN $a_{hex}$ (3.189 vs 3.183)
Figure 8:
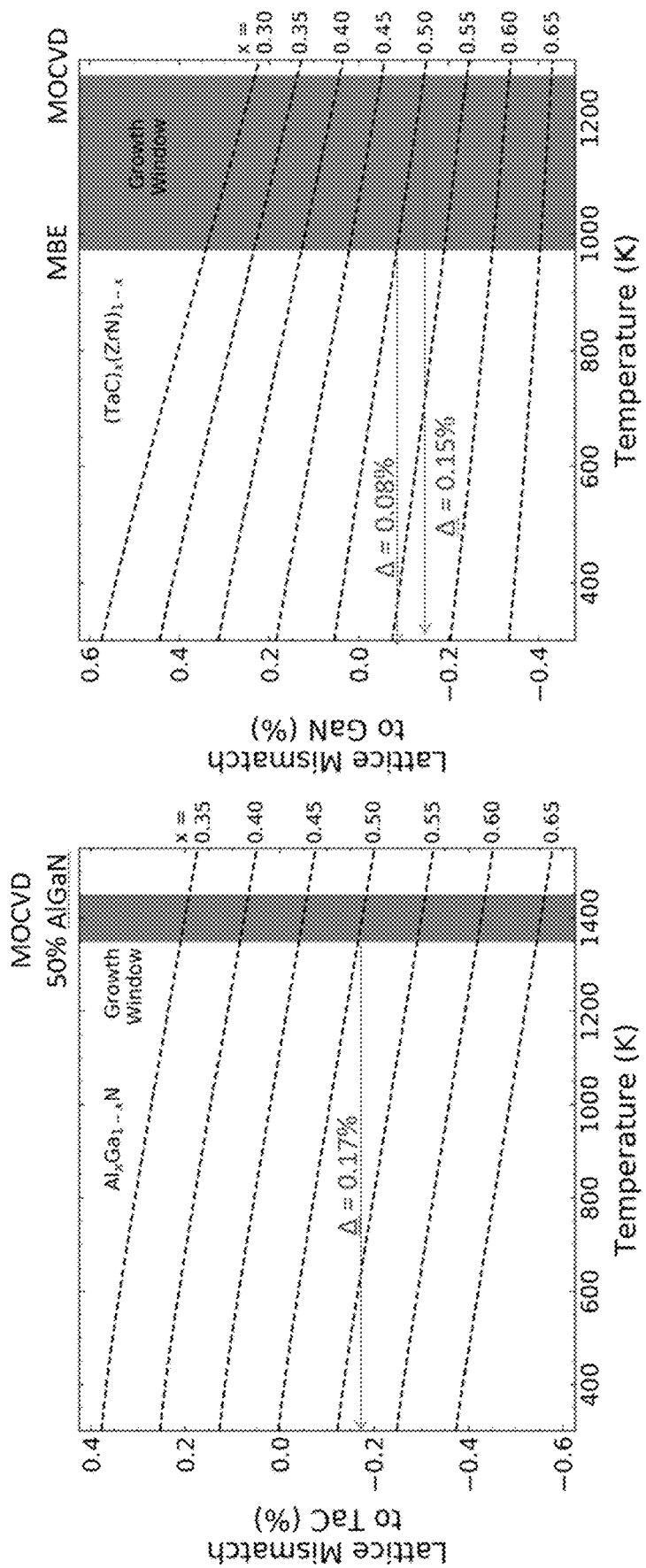
FIG. 8 illustrates Thermal mismatch during growth. For AlGaN growth—smaller CTE and lattice mismatch, For GaN growth—low CTE mismatch.
Figure 9:
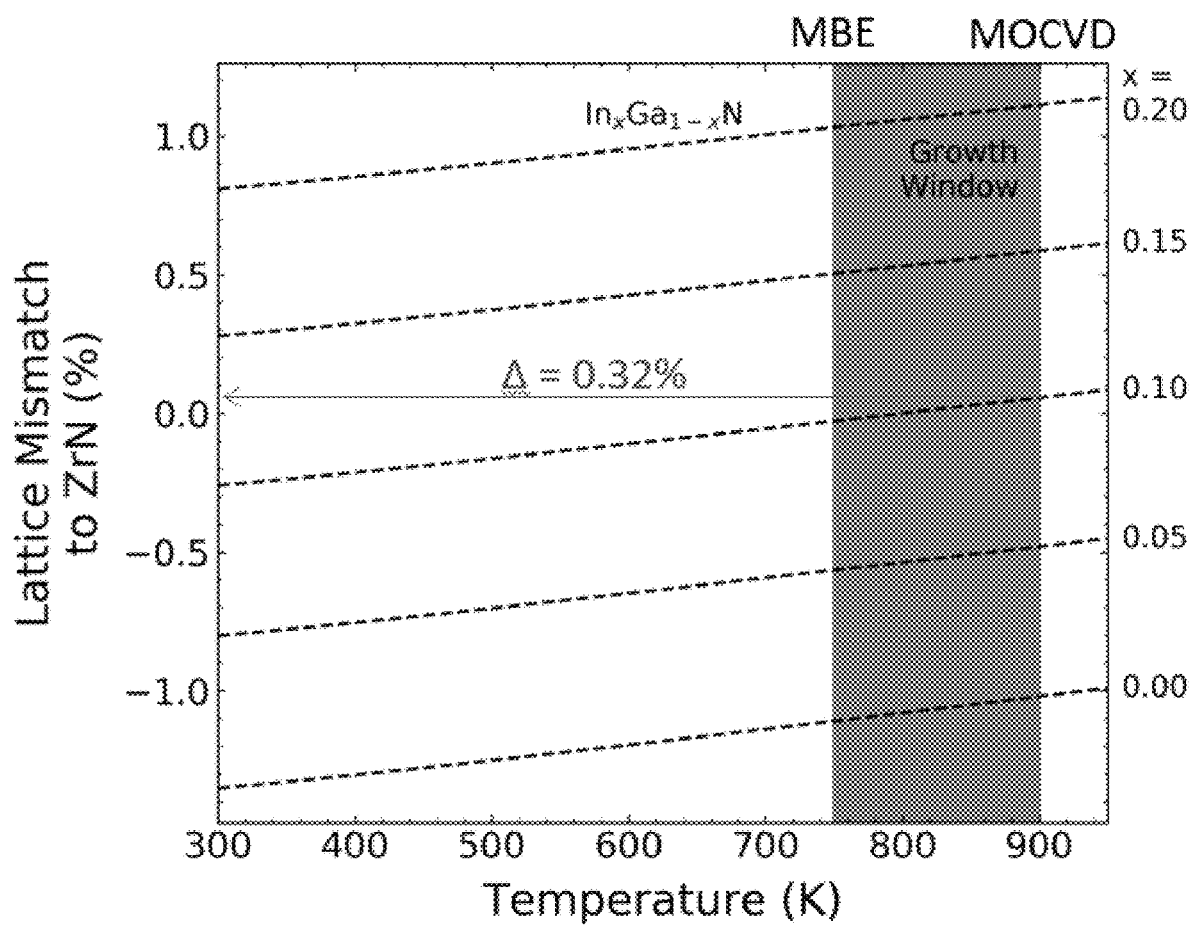
FIG. 9 illustrates Thermal mismatch during growth. For InGaN growth, similar CTE mismatch but smaller lattice mismatch.
Figure 10:
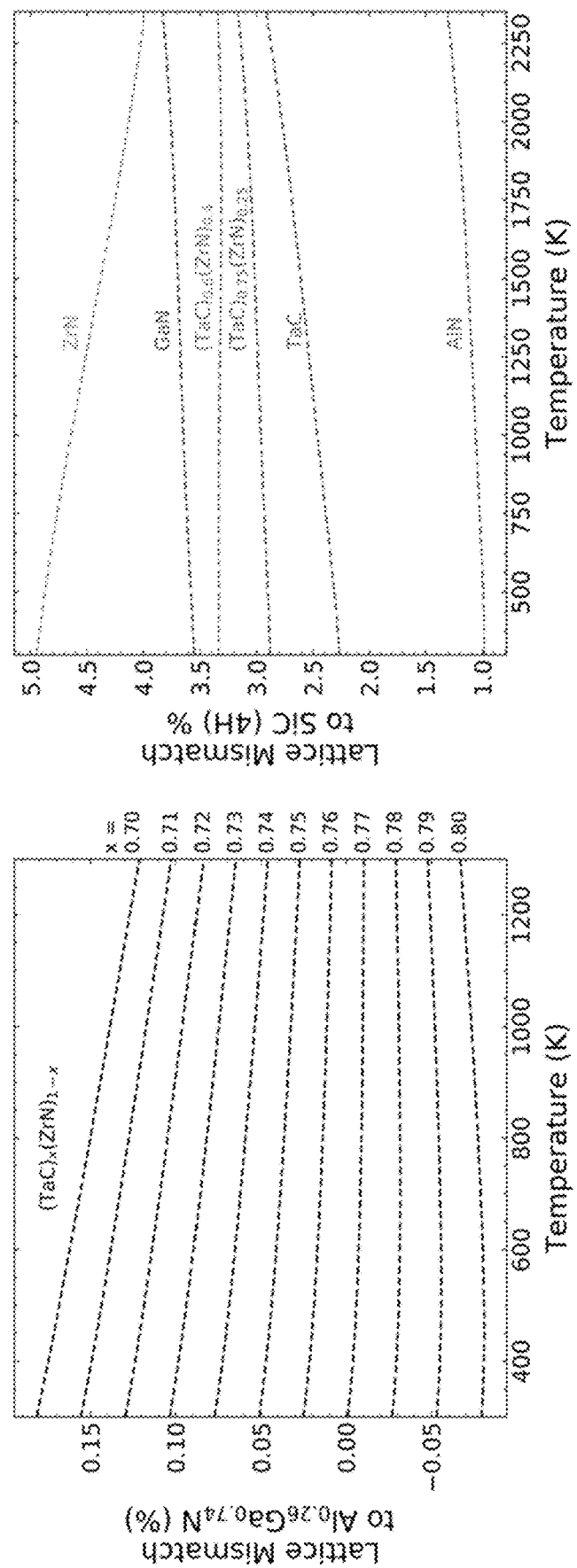
FIG. 10 provides an example of finding optimal lattice and CTE mismatch. Due to different CTE in TaC and ZrN, the slope can be tuned flat as a function of alloy content when compared to AlGaN. 26% AlGaN is lattice and CTE matched to $(TaC)_{0.77}(ZrN)_{0.23}$ which is similar to 25% ZrN which is an ordered structure.
Figure 11:
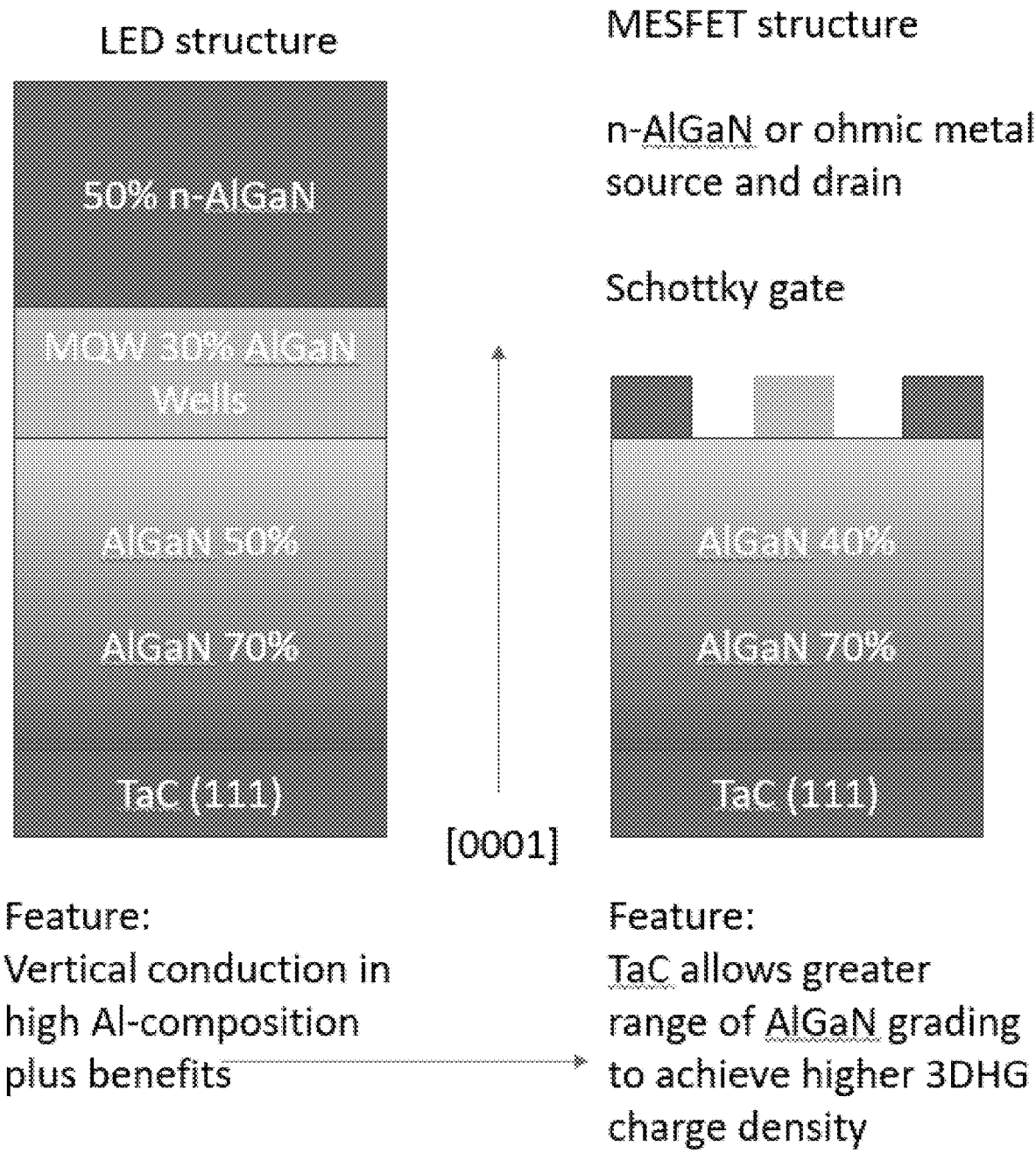
FIG. 11 provides exemplary high temperature devices. There are a limited MESFETs for the desired temperature rage. The growth of 50% AlGaN enables a vertical diode.

The optimized TMC and TMN films are face-to-face annealed at temperatures ranging from 1200° C. to 2000° C. or greater. For temperatures less than 1800° C., an alumina tube furnace (SERF W210) will is used while flowing a slight positive pressure of purified N$_2$ gas. For temperatures in excess of 1800° C., a High-Flux Solar Furnace (HFSF) facility is employed. The HFSF, depicted in FIG. 3, is a 10 kW optical furnace that can deliver 250 W/cm$^2$ with the primary optics and much greater concentration with secondary focusing optics. Anneals in the HFSF use a custom-built annealing chamber that will allow uniform heating while flowing purified N$_2$ gas. This high temperature annealing technology is investigated as a function of time and temperature for TaC, TaN, and TaC$_x$N$_{1-x}$. To improve heat absorption and uniformity for growth and annealing, sapphire substrates are backside-coated with Ta, a process already in use for MBE growth on transparent substrates.

Finally, epilayers are grown on the annealed substrates. This allows a direct comparison to epilayers grown using traditional substrates. As an example, Al$_{0.55}$Ga$_{0.45}$N is epitaxially grown on TaC. All epilayer growth occurs using a Riber molecular beam epitaxy (MBE) tool equipped for III-N growth. Pre- and post-annealed sputtered films and epilayers are analyzed by reflection high-energy electron diffraction, X-ray diffraction, atomic force microscopy, and transmission electron microscopy to understand crystal quality, morphology, and defect concentrations.

Example 3—Annealed Carbonitride Epitaxial Substrate

Described is a family of materials to be used as virtual epitaxial substrates, and method of preparing the substrates. A carbonitride, consisting of a metal cation, or combination of metal cations, and an anion either carbon, nitrogen, or a mixture of the two, is deposited on a high-temperature stable substrate. The high temperature substrate with deposited metal carbonitride film is then face-to-face annealed at high temperatures to recrystallize and reduce defects. The substrate can be Al$_2$O$_3$, SiC, or MgO. High temperature anneal may be important to improve the structural quality of the metal carbonitride film (e.g., TaC). High structural quality (degree of perfection in the periodic location of atoms in the crystal structure) may facilitate the epitaxial growth of the device on the substrate, as illustrated in FIGS. 19A-19B.

FIGS. 20A-20B illustrate the crystalline quality and epitaxial relationship between the metal carbonitride film (in this case TaC) and the substrate (sapphire, Al$_2$O$_3$), further demonstrating the ability of sputtered and annealed TaC to possess 1) high crystalline quality in 2) the correct structure with 3) correct orientation.

For group-III nitride epitaxy, the carbonitride of interest may have a thermodynamic ground state structure that is rock salt. The rock salt compound must be deposited with texture so that the (111) crystalline plane is normal to the surface, forming a hexagonal lattice.

Examples

NbC and TaC are lattice-matched to Al$_{0.55}$Ga$_{0.45}$N
ScC is lattice-matched to GaN
Al$_x$Ga$_{1-x}$N is accessible across the range x=1-0.55 through a potential Nb(C,N) system, where it is thermodynamically stable (NbN is not rock salt ground state)
ZrN is lattice matched to In$_{0.2}$Ga$_{0.8}$N
HfC is lattice-matched to In$_{0.24}$Ga$_{0.76}$N
ZrC is lattice matched to In$_{0.36}$Ga$_{0.74}$N For any material of interest for thin film application that does not possess a commercially available bulk substrate, heteroepitaxy is difficult if not impossible. In the case of III-N epitaxy there is no native substrate for (Al, Ga)N alloys, and between Al compositions of 30%-70% films cannot be grown pseudomorphically (strained) to AlN or GaN substrates. AlN and GaN substrates are commercially available but are expensive and created by non-scalable techniques unlikely to be adopted by any commercial industry. The same is true for (In, Ga)N alloys, with the addition that InN substrates do not exist. The present invention provides a method for creating virtual hexagonal substrates suitable for lattice matched epitaxy across the entire III-N alloy space.

The provided disclosure may be further understood by the following non-limiting examples:

Example 1. A device comprising:
a semiconducting material comprising a transition metal and N, wherein the transition metal is selected from the group of Al, Ga, In or a combination thereof; and
a rock salt substrate, wherein the semiconducting material is deposited on the rock salt substrate.

Example 2. The device of example 1, wherein the semiconducting material is lattice matched to the rock salt substrate.

Example 3. The device of example 1 or 2, wherein the semiconducting material is deposited on the rock salt substrate via heteroepitaxy.

Example 4. The device of any of examples 1-3, wherein the semiconducting material is face-to-face annealed to the rock salt substrate.

Example 5. The device of example 4, wherein the semiconducting material is annealed at a temperature greater than or equal to 1500° C.

Example 6. The device of any of examples 1-5, wherein the rock salt substrate comprises a transition metal nitride, transition metal carbide or a transition metal carbonitride.

Example 7. The device of any of examples 1-6, wherein the rock salt substrate is selected from the group of TaC, TaN, NbN, NbC, ZrN, ZrC, ScC, ScN, HfN, HfC, an alloy thereof or a combination thereof.

Example 8. The device of any of examples 1-7, wherein the rock salt substrate is TaC, TaN, ZrN, alloys thereof or a combination thereof.

Example 9. The device of any of examples 1-8, wherein the semiconducting material has an Al concentration selected from the range of 30% to 80%.

Example 10. The device of any of examples 1-9, wherein the semiconducting material is defined by the formula Al$_x$Ga$_{1-x}$N, wherein x is selected from the range of 0.3 to 0.8.

Example 11. The device of any of examples 1-10, wherein the device is an ultra-wide bandgap semiconductor.

Example 12. The device of any of examples 1-11, wherein the semiconducting material and the rock salt substrate have a lattice constant selected from the range of 3.0 to 3.2 angstroms.

Example 13. The device of any of examples 1-12, where the rock salt substrate comprises a transition metal nitride, transition metal carbide or a transition metal carbonitride film deposited on a $Al_2O_3$, SiC, or MgO substrate.

Example 14. The device of example 13, wherein the substrate is sapphire ($Al_2O_3$)

Example 15. An epitaxial substrate comprising:

a high-temperature substrate; and a carbonitride layer a transition metal cation and N, C or a combination thereof, wherein the epitaxial substrate is face-to-face annealed.

Example 16. The epitaxial substrate of example 15, wherein the carbonitride film comprises two or more transition metal cations.

Example 17. The epitaxial substrate of example 15 or 16, wherein the transition metal is selected from the group Ta, Nb, Sc, Hf, Zr or a combination thereof.

Example 18. The epitaxial substrate of any of examples 15-17, wherein the carbonitride layer has a thermodynamic ground state of rock salt.

Example 19. The epitaxial substrate of any of examples 15-18, wherein the high-temperature substrate is selected from the group of $Al_2O_3$, SiC, or MgO.

Example 20. The epitaxial substrate of example 19, wherein the high-temperature substrate is sapphire ($Al_2O_3$).

Example 21. The epitaxial substrate of any of examples 15-20, wherein the carbonitride layer is a bulk rock salt material.

Example 22. The epitaxial substrate of any of examples 15-21, wherein the carbonitride layer is a thin film.

Example 23. The epitaxial substrate of any of examples 15-22, wherein the epitaxial substrate is face-to-face annealed at a temperature greater than or equal to 1500° C.

Example 24. A method of making the device of any of examples 1-14.

Example 25. A method of making the epitaxial substrate of any of examples 15-23.

Example 26. A method comprising:

providing a high-temperature substrate;

sputtering a carbonitride layer a transition metal cation and N, C or a combination thereof on a surface of the high-temperature substrate;

annealing the carbonitride layer.

Example 27. The method of example 26 further comprising:

depositing a semiconducting material comprising a transition metal and N, wherein the transition metal is selected from the group of Al, Ga, In or a combination thereof, wherein the step of depositing a semiconducting material is performed via molecular beam epitaxy.

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

As used herein and in the appended claims, the singular forms "a", "an", and "the" include plural reference unless the context clearly dictates otherwise. Thus, for example, reference to "a cell" includes a plurality of such cells and equivalents thereof known to those skilled in the art. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is interchangeable with the expression "as in any one of claims XX-YY."

When a group of substituents is disclosed herein, it is understood that all individual members of that group and all subgroups, are disclosed separately. When a Markush group or other grouping is used herein, all individual members of the group and all combinations and subcombinations possible of the group are intended to be individually included in the disclosure. For example, when a device is set forth disclosing a range of materials, device components, and/or device configurations, the description is intended to include specific reference of each combination and/or variation corresponding to the disclosed range.

Every formulation or combination of components described or exemplified herein can be used to practice the invention, unless otherwise stated.

Whenever a range is given in the specification, for example, a density range, a number range, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:

1. A device comprising:
    a semiconducting material comprising a transition metal and N, wherein the transition metal is selected from the group of Al, Ga, In or a combination thereof; and
    a rock salt substrate, wherein the semiconducting material is deposited on the rock salt substrate;
    wherein the rock salt substrate is selected from the group of TaC, NbC, ZrC, ScC, HfC, an alloy thereof or a combination thereof.

2. The device of claim 1, wherein the semiconducting material is lattice matched to the rock salt substrate.

3. The device of claim 1, wherein the semiconducting material is deposited on the rock salt substrate via heteroepitaxy.

4. The device of claim 1, wherein the semiconducting material is face-to-face annealed to the rock salt substrate.

5. The device of claim 1, wherein the semiconducting material has an Al concentration selected from the range of 30% to 80%.

6. The device of claim 1, wherein the semiconducting material is defined by the formula $Al_xGa_{1-x}N$, wherein x is selected from the range of 0.3 to 0.8.

7. The device of claim 1, wherein the device is an ultra-wide bandgap semiconductor.

8. The device of claim 1, wherein the semiconducting material and the rock salt substrate have a lattice constant selected from the range of 3.0 to 3.2 angstroms.

9. The device of claim 1, where the rock salt substrate comprises film deposited on a $Al_2O_3$, SiC, or MgO substrate.

10. An epitaxial substrate comprising:
    a substrate; and
    a carbide layer comprising a transition metal cation and C or CN, wherein the epitaxial substrate is face-to-face annealed.

11. The epitaxial substrate of claim 10, wherein the carbide layer comprises two or more transition metal cations.

12. The epitaxial substrate of claim 10, wherein the transition metal is selected from the group Ta, Nb, Sc, Hf, Zr or a combination thereof.

13. The epitaxial substrate of claim 10, wherein the carbide layer has a thermodynamic ground state of rock salt.

14. The epitaxial substrate of claim 10, wherein the substrate is selected from the group of $Al_2O_3$, SiC, or MgO.

15. The epitaxial substrate of claim 10, wherein the carbide layer is a thin film.

* * * * *